(12) United States Patent
Honma et al.

(10) Patent No.: US 7,349,249 B2
(45) Date of Patent: Mar. 25, 2008

(54) SEMICONDUCTOR MEMORY DEVICE

(75) Inventors: Mitsuaki Honma, Yokohama (JP);
Noboru Shibata, Kawasaki (JP);
Kazunori Kanebako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 11/389,083

(22) Filed: Mar. 27, 2006

(65) Prior Publication Data
US 2006/0215450 A1   Sep. 28, 2006

(30) Foreign Application Priority Data
Mar. 28, 2005   (JP)   ............................. 2005-090855

(51) Int. Cl.
*G11C 11/34* (2006.01)
(52) U.S. Cl. ............................. 365/185.03; 365/185.24; 365/185.19; 365/185.29
(58) Field of Classification Search ........... 365/185.03, 365/185.24, 185.19, 185.29
See application file for complete search history.

(56) References Cited

U.S. PATENT DOCUMENTS 5,191,556 A * 3/1993 Radjy ..................... 365/185.33
6,288,935 B1   9/2001 Shibata et al.
6,426,892 B2   7/2002 Shibata et al.
6,496,412 B1   12/2002 Shibata et al.

FOREIGN PATENT DOCUMENTS

JP   2001-93288   4/2001

* cited by examiner

*Primary Examiner*—Son Dinh
*Assistant Examiner*—Nam Nguyen
(74) *Attorney, Agent, or Firm*—Oblon, Spivak, McClelland, Maier & Neustadt, P.C.

(57) ABSTRACT

A semiconductor memory device includes a memory cell array with memory cells arranged therein, each memory cell storing data defined by threshold voltage thereof, wherein the memory cell array includes first and second areas; the first area stores multi-value data written with plural write steps; and the second area stores binary data defined by first and second logic states, threshold levels of which are controlled through the plural write steps adapted to the multi-value data write.

20 Claims, 15 Drawing Sheets

Normal Data Area

Flag Data Area

Flag Data Area

Normal Data Area

Flag Data Area

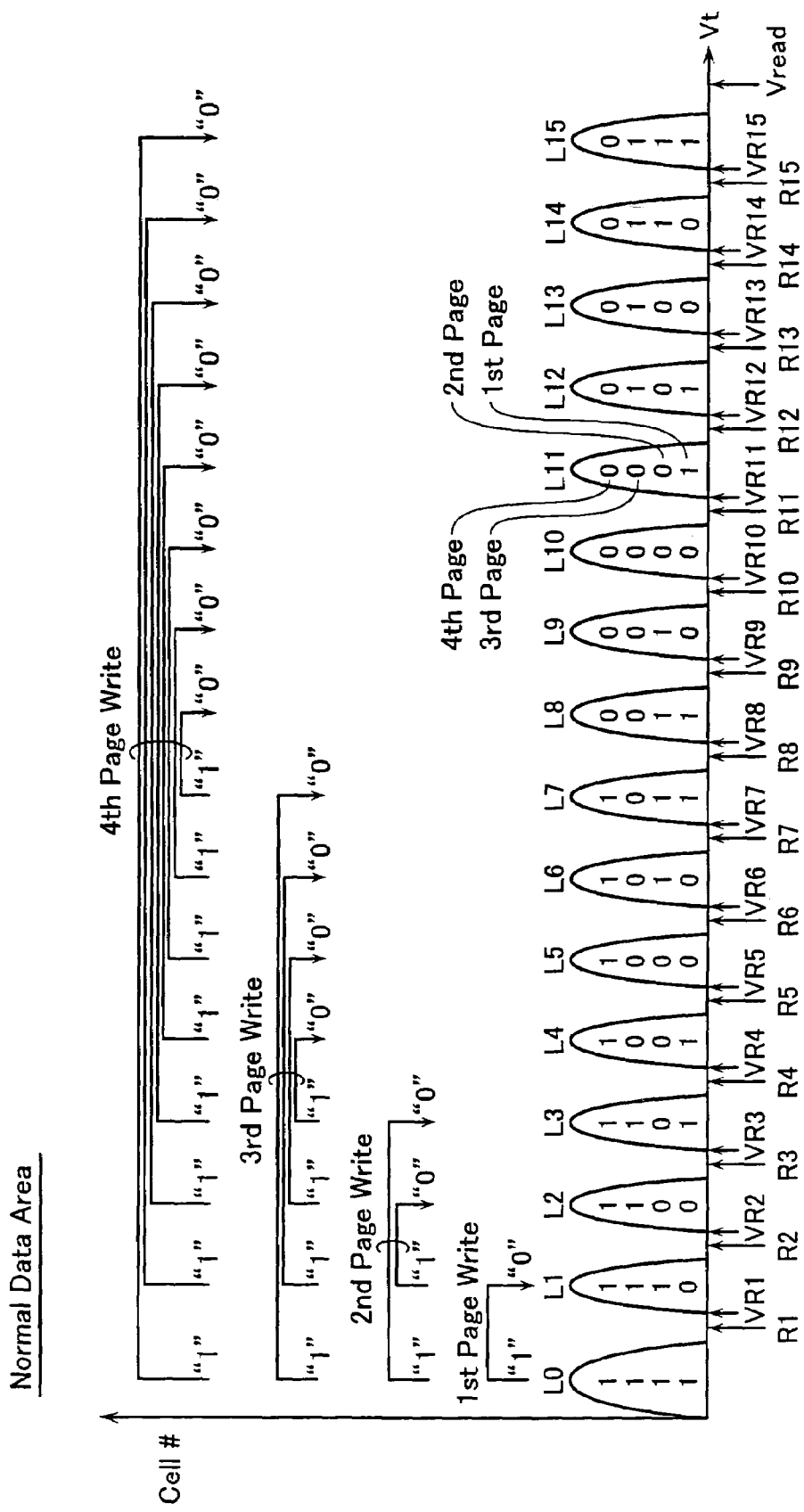
FIG. 12A Normal Data Area

SEMICONDUCTOR MEMORY DEVICE

CROSS-REFERENCE TO RELATED APPLICATION

This application is based on and claims the benefit of priority from the prior Japanese Patent Application No. 2005-090855, filed on Mar. 28, 2005, the entire contents of which are incorporated herein by reference.

BACKGROUND OF THE INVENTION

1. Field of the Invention

This invention relates to a semiconductor memory device, especially relates to an electrically rewritable and non-volatile memory (EEPROM).

2. Description of Related Art

A NAND-type flash memory is known as one of EEPROMs. In the NAND-type flash memory, a memory cell array is formed of NAND cell units with a small unit cell area, in which plural memory cells are connected in series to constitute a NAND cell unit. Therefore, the memory capacitance may be easily increased in comparison with a NOR-type flash memory.

Recently, to achieve a large capacitive NAND-type flash memory, there have been provided various kinds of multi-value storage schemes, in each of which one memory cell store two or more bits (for example, refer to Unexamined Japanese Patent Application Publication No. 2001-93288, or Unexamined Japanese Patent Application Publication No. 2000-195280).

At a data read time of the NAND-type flash memory, a selected word line in a selected NAND block is applied with a read voltage, which turns on or off the selected cell in accordance with cell data; and non-selected word lines are applied with a read pass voltage, Vread, which turns on cells without regard to cell data. With this voltage application, a sense amplifier detects whether the selected cell is on or off via a bit line, thereby sensing data.

In the conventional flash memory, data is defined by memory cell's threshold voltage level. Therefore, in case of a multi-value data storage scheme, various threshold levels are used. While it is in need of setting the above-described read pass voltage Vread to be higher than the uppermost one in the threshold levels to be set in a cell, as the number of threshold levels is increased more, data margin between cell threshold levels, and a margin between the highest threshold level and the read pass voltage become less.

Therefore, it is required to control multi-value data write in such a manner that the highest threshold level is certainly lower than the read pass voltage Vread. Especially, it is difficult to control the written threshold levels in the write scheme described in Unexamined Japanese Patent Application. Publication No. 2001-93288, which includes such a write step as to boost the lowest threshold level to the highest threshold level.

SUMMARY OF THE INVENTION

According to an aspect of the present invention, there is provided a semiconductor device including a memory cell array with memory cells arranged therein, each memory cell storing data defined by threshold voltage thereof, wherein
the memory cell array includes first and second areas;
the first area stores multi-value data written with plural write steps; and
the second area stores binary data defined by first and second logic states, threshold levels of which are controlled through the plural write steps adapted to the multi-value data write.

According to another aspect of the present invention, there is provided a semiconductor memory device including:
a memory cell array having word lines and bit lines disposed to intersect each other, and electrically rewritable and non-volatile memory cells disposed at crossings of the word lines and bit lines;
a row decoder configured to selectively drive the word lines; and
a sense amplifier circuit coupled to the bit lines, wherein
the memory cell array includes first and second areas, which are defined therein as being arranged in the direction of the word lines and accessed simultaneously,
the first area stores multi-value data written with plural write steps, and
the second area stores binary data defined by first and second logic states, which are written through the plural write steps adapted to the multi-value data write.

BRIEF DESCRIPTION OF THE DRAWINGS

FIG. 12A shows threshold voltage distributions, data bit assignment and write method of 16-value data in the normal data area of a flash memory in accordance with another embodiment.

DETAILED DESCRIPTION OF THE EMBODIMENTS

Illustrative embodiments of this invention will be explained with reference to the accompanying drawings below.

In the NAND-type flash memory in accordance with an embodiment, the memory cell array has a first area prepared for storing multi-value data (e.g., 8-value data) and a second area prepared for storing binary data. The first area is a normal data storage area while the second data area is a flag data area, which is prepared for users to be able to store some information for the normal area such as rewrite-inhibition, rewrite-limitation, rewrite-permission and the like.

Figure 1A:
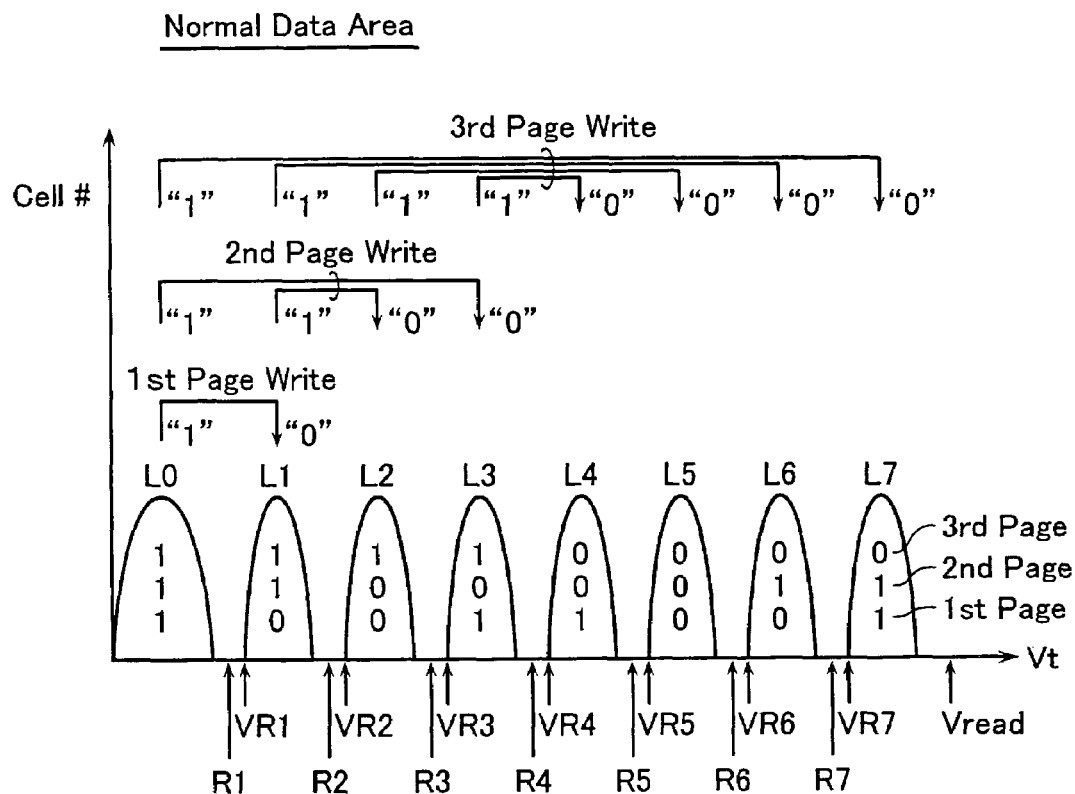
FIG. 1A shows-threshold voltage distributions, data bit assignment and write method of 8-value data in the normal data area of a flash memory in accordance with an embodiment.
Figure 1B:
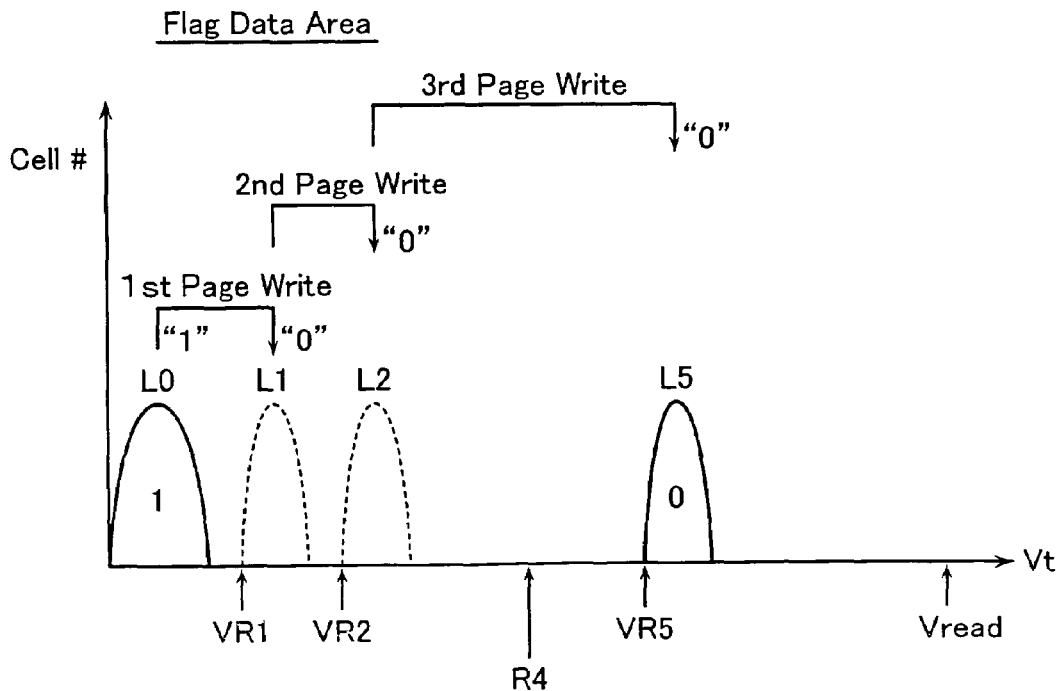
FIG. 1B shows threshold voltage distributions, data bit assignment and write method of binary data in the flag data area of the flash memory.

FIGS. 1A and 1B show, with respect to the above-described flash memory, (a) data threshold level distributions and a bit assignment and a writing method in the normal data area for storing 8-value data, and (b) those in the flag data area which is selected or accessed simultaneously with the normal data area for storing binary data, respectively.

The entire memory cells are set in a state of the lowest threshold level L0 after erasing. In the normal data area, 8-value data defined by threshold levels L0-L7 is written through three write steps. By contrast, the flag data area is subjected to the same three write steps as in the normal data area, the former two steps of which are used as dummy steps. And the binary data defined by first and second logic states is written into the flag data area in such a way that threshold levels thereof are determined in accordance with bit data in the three write steps. In detail, in the example shown in FIG. 1B, the binary data is written as follows: the lowest threshold level L0 serves as a first logic data; and threshold level L5 as a second logic data.

In the example shown in FIGS. 1A and 1B, level L5 is used as the second logic state in binary data. By contrast, select the write data set in the dummy write steps, and it is possible to use one of other threshold levels as the second logic state. In detail, the second logic data may be selected within levels L4-L6, which are higher than the center level in 8-value data, except the highest threshold level L7.

In the third write step for the normal data area, there is a cell, which is written into the highest threshold level L7 from the lowest threshold level L0. Supposing that the same write step is used once, it is able to write the highest level L7 into the flag data area as the second logic data.

However, in accordance with this write method with a large threshold level change, there is danger that the second logic state in the flag data area becomes over the read pass voltage Vread. If the reliability of the flag data is required to be higher than that in the normal data area, it is not desirable to use the above-described flag data writing method.

By contrast, in case, as described above, the three write steps used for the normal data write are adapted to the flag data area in such a manner that two in the three steps are dealt with dummy write steps, it becomes possible to set the second logic state of the binary data to be in one of levels L4-L6 at the upper side and lower than the highest threshold level L7. As a result, it is able to certainly secure the reliability of the flag data.

Next, the detail of the NAND-type flash memory in accordance with this embodiment will be explained.

Figure 2:
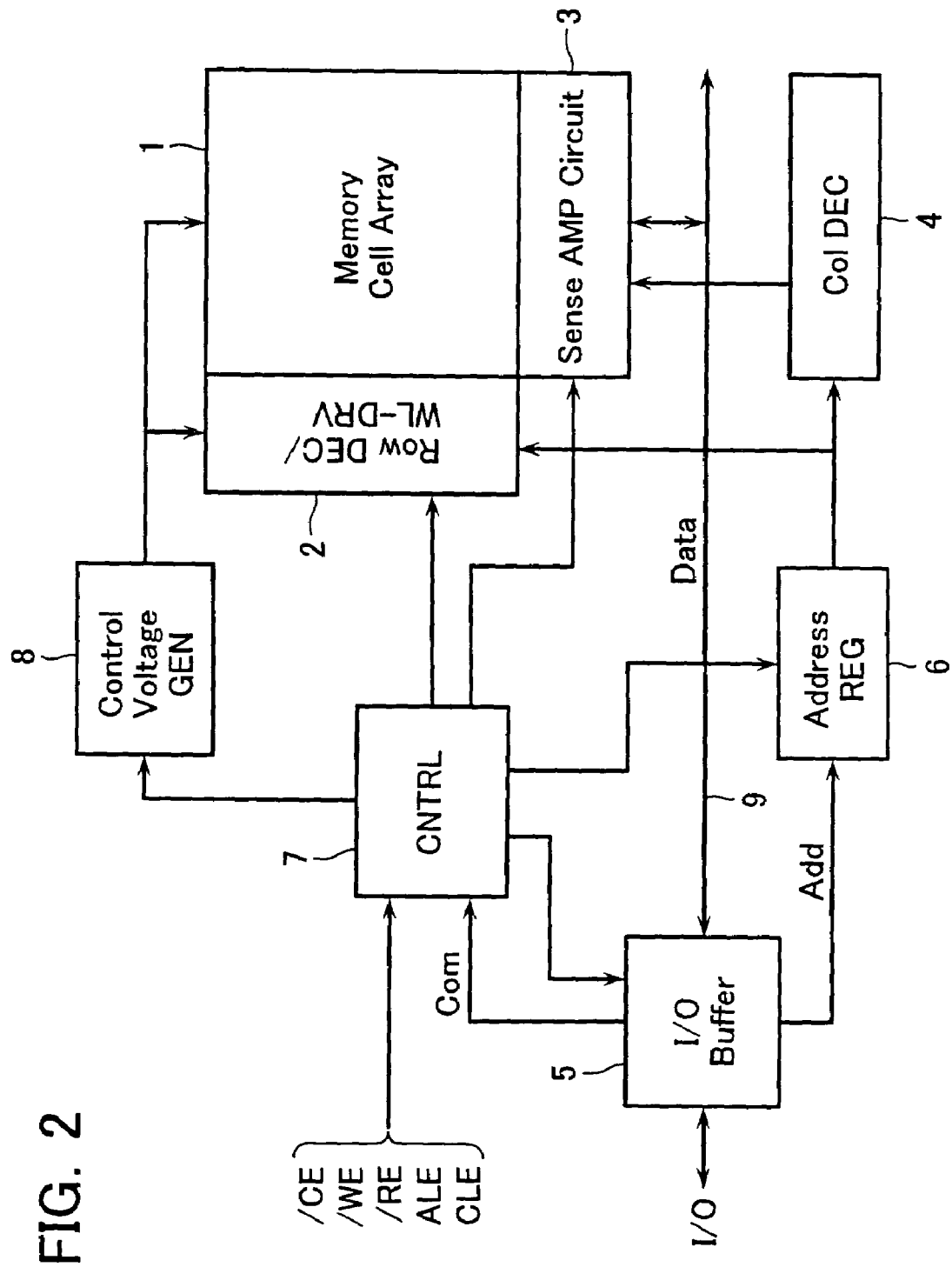
FIG. 2 shows a functional block of the NAND-type flash memory.
Figure 3:
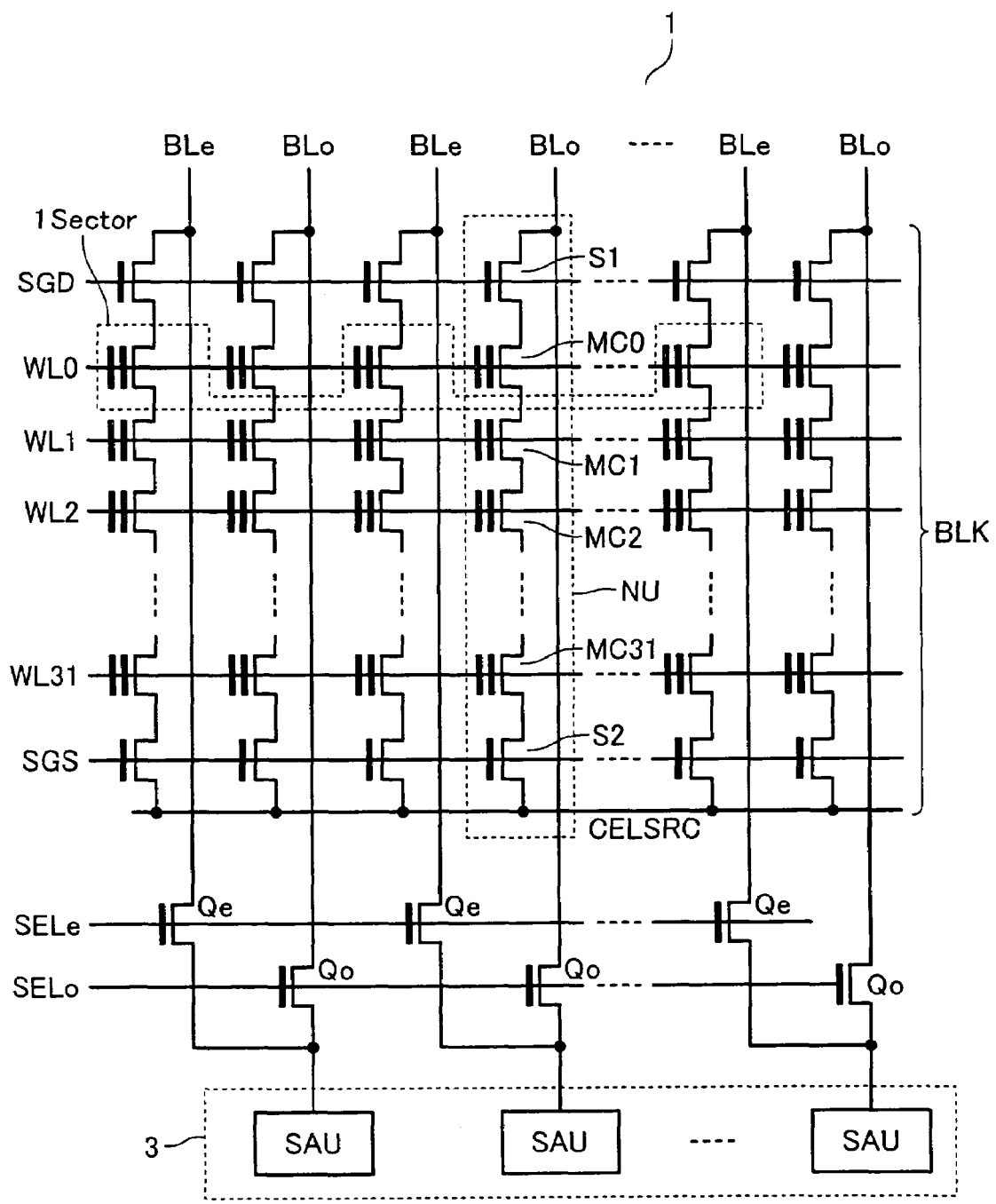
FIG. 3 shows a memory cell array configuration of the flash memory.

FIG. 2 shows a functional block configuration of the NAND-type flash memory chip in accordance with this embodiment. The memory cell array 1 is, as shown in FIG. 3, formed of NAND cell units, NU, arranged therein. Each NAND cell unit NU has electrically rewritable and non-volatile memory cells (thirty two cells in the example shown in FIG. 3) MC0-MC31 connected in series, and select gate transistors S1 and S2, which are prepared for coupling the both ends of the cell string to a bit line BL and a source line CELSRC, respectively.

Control gates of the memory cells MC0-MC31 are coupled to different word lines WL0-WL31, respectively. Gates of the select gate transistors S1 and S2 are coupled to select gate lines SGD and SGS, respectively, which are disposed in parallel with the word lines.

A set of NAND cell units sharing word lines constitutes a block, which serves as an erase unit. Although only one block is shown in FIG. 3, plural blocks are usually arranged in the direction of the bit line.

Row decoder 2 includes word line drivers and selectively drive word lines of the memory cell-array 1. Sense amplifier circuit 3 is coupled to the bit lines, thereby serving for data reading and serving as a data latch, which stores read data and write data.

At a data read time, read data in the sense amplifier circuit 3 are output to external input/output nodes I/O via data bus 9 and data buffer 5. At a data write time, write data supplied to the input/output node I/O from an external controller are loaded in the sense amplifier circuit 3 via the data bus 9.

Command "Com" supplied from the input/output node I/O via the buffer 5 is decoded in the control signal generation circuit (internal controller) 7. Input to the controller 7 are external control signals such as chip enable signal /CE, write enable signal /WE, read enable signal /RE, address latch enable signal ALE, command latch enable signal and the like. The internal controller 7 controls data write sequence, data erase sequence and data read based on the external control signal and command supplied in accordance with an operation mode.

Address "Add" supplied from the input/output nodes I/O via the buffer 5 is transferred to the row decoder 2 and column decoder 4 via address register 6.

To generate various high voltages higher than the power supply voltage in accordance with operation modes, control voltage generating circuit 8 is prepared. The controller controls this circuit 8.

The sense amplifier circuit 3 has, as shown in FIG. 3, plural sense units, SAU, serving for performing one page data read or one page data write at a time. An even numbered bit line BLe and an adjacent odd numbered bit line BLo in the cell array 1 share a sense unit SAU. Either one of the even bit line BLe and odd bit line BLo is selected with a bit line select transistor Qe or Qo to be coupled to the sense unit SAU while the other is used as a shield line. With this scheme, it is possible to reduce the influence of capacitance coupling between bit lines in case the cell array is miniaturized.

In the above-described shared sense amplifier scheme, a set of memory cells selected with a word line and the entire even numbered bit lines is defined as a sector; and a set of memory cells selected with a word line and the entire odd numbered bit lines as another sector. One sector constitutes a page defined as a cell area, memory cells in which are physically and simultaneously accessed. In case of 4-value data storage scheme, physical one sector data (i.e., one page data) includes two sub-page data (i.e., upper page data and lower page data). In case of 8-value data storage scheme, written in one sector are three sub-page data (i.e., upper page, middle page and lower page data). In case of 16-value data storage scheme, four sub-page data are written in a sector.

Figure 4:
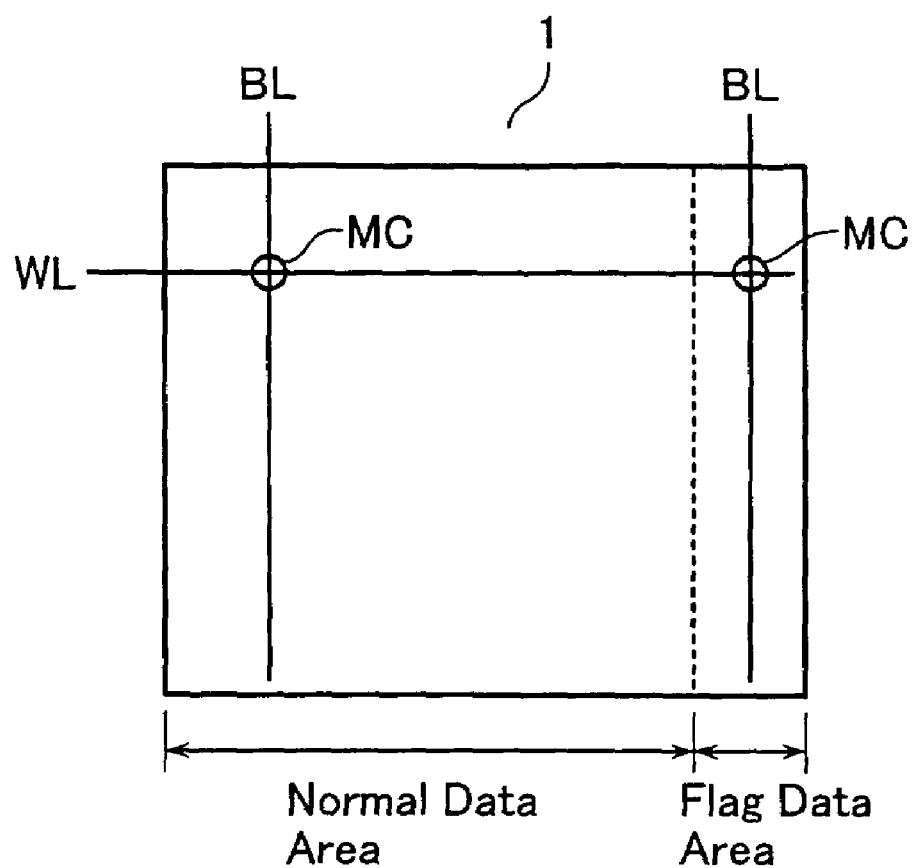
FIG. 4 shows the normal data area and the flag data area in the memory cell array.

FIG. 4 shows that the memory cell array 1 in accordance with this embodiment has a normal data area and a flag data area arranged in the direction of the word line WL. The flag data area contains such verify-readable information that users optionally set to notify whether it is permitted to rewrite the normal data area or not.

To secure the reliability of the flag data, it is desired to take decision by majority in plural bits. As the flag data, other suitable and additional information may be contained in addition to rewrite-permission or rewrite-inhibition.

Figure 5:
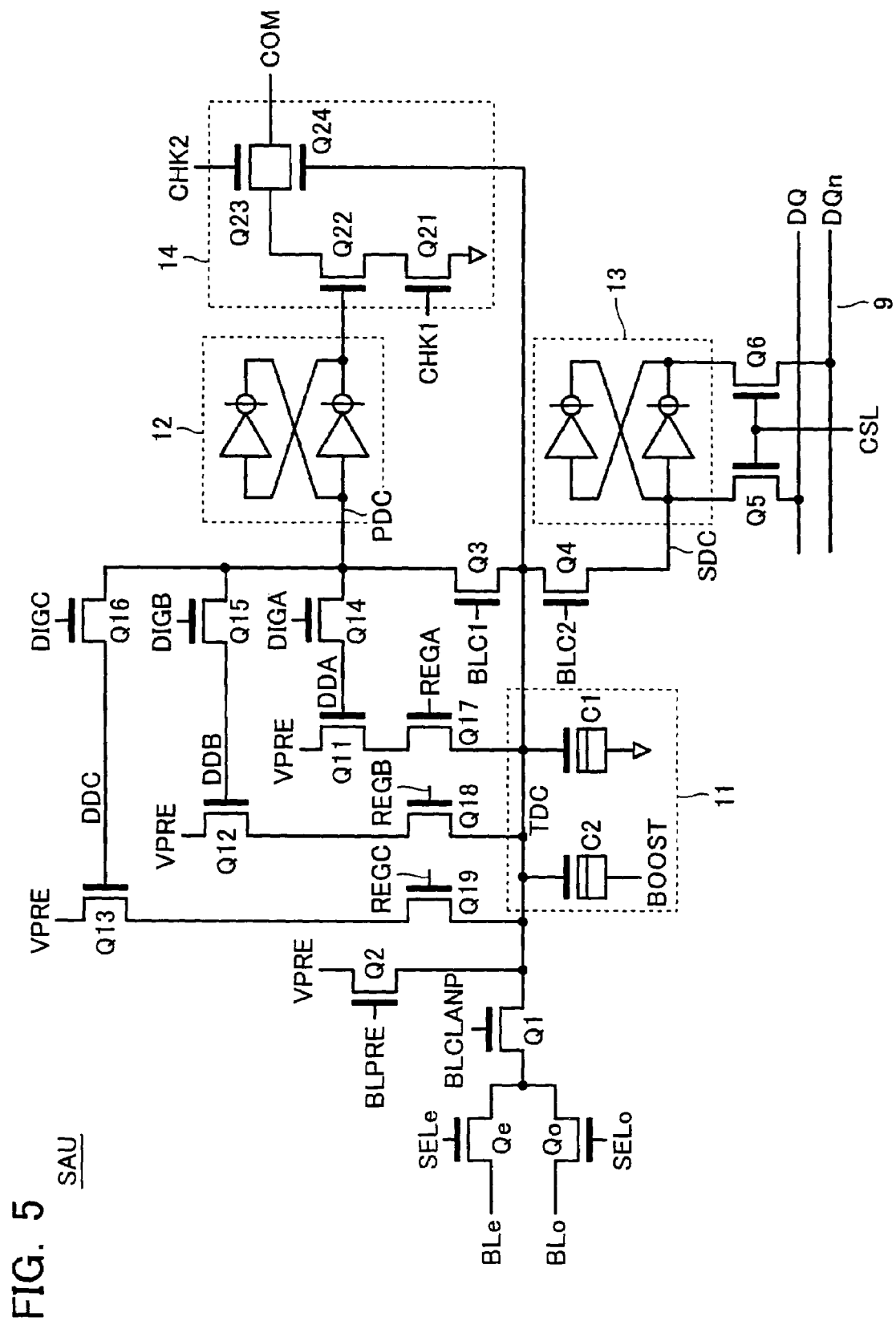
FIG. 5 shows a sense unit configuration of the flash memory.

FIG. 5 shows a detailed configuration of one sense unit SAU in the sense amplifier circuit 3. Node TDC serves as not only a sense node for sensing bit line voltage but also a data storage node for temporarily storing data. The node TDC constitutes a temporal data storage circuit 11 together with a charge hold capacitor C1 and a boost capacitor C2.

Clamping NMOS transistor Q1 serves for clamping the bit line voltage and transferring it to the data node TDC at a read time. Further Connected to the node TDC is precharging NMOS transistor Q2, which serves for precharging a bit line and the data node TDC.

Node TDC is coupled to data storage nodes PDC and SDC of data latches 12 and 13 via transferring NMOS transistors Q3 and Q4, respectively. Data latch 12 serves as a data storage circuit for holding read data and write data. Data latch 13 is disposed between data latch 12 and data lines DQ, DQn and serves as a data cache for temporarily storing read or write data.

Nodes of data latch 13 are coupled to data lines DQ, DQn in data bus 9 via select gate transistors Q5 and Q6, respectively, driven by column select signal CSL.

Data write is performed for obtaining a certain threshold distribution by repeat of a write voltage application and a write-verify. The write-verify is performed for every bit, and it is required to decide the next cycle write data in accordance with the verify result.

The gate of NMOS transistor Q11, the drain of which is applied with voltage VPRE, serves as a data storage node DDA for temporarily caching the write data held at the node PDC of data latch 12. The write data at the node PDC is transferred to the data storage node DDA via transferring NMOS transistor Q14. VPRE is selectively set to be Vdd or Vss.

With NMOS transistors Q11 and Q17, the latter of which is disposed between the former transistor Q11 and data storage node TDC, it becomes possible to set data at the data storage node TDC in accordance with data held at data storage node DDA. In other words, these transistors Q11 and Q17 constitute a write back circuit for writing back the next cycle write data at the node TDC in a write mode.

In the multi-value data storage scheme in accordance with this embodiment, to perform write-verify control for a currently writing page, it becomes in need of referring to another page data lower than a page, which has already been written. For example, in 8-value storage scheme, in which three pages, first, second and third-pages, are written, it is required to refer to the first page for the second page write, and refer to the first and second pages for the third page write.

To respond to the above-described demand, gates of NMOS transistors Q12 and Q13 are used as data storage nodes DDB and DDC, respectively, which are disposed in parallel in addition to the data storage node DDA for temporarily storing write data. To transfer read page data in the data latch 12 to these data nodes DDB and DDC, transfer NMOS transistors Q15 and Q16 are disposed. In addition, transfer NMOS transistors Q18 and Q19 are disposed between transistors Q12 and Q13 and data node TDC.

Based on data held at these data storage nodes DDA, DDB and DDC, and in accordance with the selection of drain voltage VPRE applied to the transistors Q11, Q12 and Q13, it becomes possible to control the data node TDC at a write-verify time in such a way that it is forcedly discharged (i.e., set to be a "L" level), or charged up (i.e., set to be a "H" level).

Coupled to the data latch 12 is a verify-check circuit 14. NMOS transistor Q22, the gate of which is coupled to one node of data latch 12, serves as a checking transistor. The source of transistor Q22 is connected to Vss node via NMOS transistor Q21, which is driven with a check signal CHK1; and the drain to a common signal line COM, which is disposed in common to one page sense units, via transferring NMOS transistors Q23 and Q24 disposed in parallel to be driven by a check signal CHK2 and node TDC, respectively.

Only when "0" write is detected as being insufficient as a result of verify-read, such a write-back is performed that data node RDC of data latch 12 is set to be "L" (="0"). In other words, the write-verify is so controlled that in case one page write has been completed, one page data latches 12 become an all "1" state.

After verify-read in a data write mode, verify-check circuits 14 in one page sense units are activated. If data write has not been completed in a sense unit, verify-check circuit 14 therein will discharge the common signal line COM, which is precharged to be an "H" level. If all is "1" with data latches 12 in one page sense units, the common signal line COM is kept at the precharged "H" level as it is, and it becomes a pass flag notifying the write completion.

Next, prior to the explanation of detailed operations in the multi-value data storage scheme, basic operations of data write and read will be explained with reference to the sense unit SAU shown in FIG. 5. This is because that data write and read of binary data "0", "1" is basically performed in case of the multi-value data storage scheme.

Prior to data write into a block of the memory cell array, it is subjected to data erase. The erase operation is performed with an erase voltage Vera (e.g., 20V) applied to the p-type well, on which the memory cell array is formed, on the condition that the entire word lines in the block are set to be Vss.

With this voltage application, the entire memory cells in the block become an erase state defined by a low threshold voltage (i.e., negative threshold voltage state) as a result of that electrons in the floating gates are discharged. Usually, this erase state is defined as data "1" state. Data erase is performed by repeat of the erase voltage application and the following erase-verify for verifying the erased state.

Data write is performed with such a "0" write operation as to inject electrons into a memory cell's floating gate, thereby making the cell's threshold voltage higher. Write data "1" is dealt with such a write-inhibiting operation that the above-described electron injection does not occur.

In a data write mode of the NAND-type flash memory in accordance with this embodiment, channels of selected cells are set in accordance with write data to be Vdd-Vt (in case of "1" write, i.e., write inhibiting) and Vss (in case of "0" write), respectively, via bit lines, and then write voltage Vpgm, for example 20V, is applied to a selected word line.

In a "0" write cell, electron is injected from the channel to the floating gate, so that the threshold voltage will be increased.

The channel potential control in the data write mode is performed based on the write data stored in data latch 12 in the sense unit SAU. That is, "L" and "H" data are held at the node PDC of data latch 12 in accordance with write data "0" and "1", respectively. Based of these write data, Vss and Vdd-Vt (where, Vt is threshold voltage of the select gate transistor) are transferred to the channels of selected cells.

In the data write mode, non-selected word lines are applied with a write pass voltage Vpass of about 10V. As a result, channels of the non-selected cells are boosted in potential by capacitive coupling, thereby preventing these non-selected cells from being electron-injected.

Data read is performed by detecting whether selected cells are on or off via bit lines on the condition that a read voltage is applied to a selected word line; and read pass voltage Vread to the remaining non-selected word lines. For this purpose, the clamping transistor Q1 and precharge transistor Q2 are turned on in a state that the select gate transistors in the NAND cell unit are off, thereby precharging bit lines at a certain level. Following it the bit line precharge is stopped, and then the NAND cell units with the above-described bias applied are coupled to the bit lines.

As a result, in case a cell's threshold voltage is lower than the read voltage (i.e., in case of data "1"), the corresponding bit line is discharged while in case a cell's threshold voltage is higher than the read voltage (i.e., in case of data "0"), the corresponding bit line will not be discharged.

Bit line potential difference after the bit line discharge operation is detected at the node TDC with a certain sensing voltage applied to the clamping transistor Q1. That is, data "0" and "1" are detected as data "H" and "L", respectively, at the node TDC, and the sensed result is latched in the data latch 12.

Data write is performed, in practice, by repeat of the write voltage application and write-verify for verifying the write state for setting the write data into certain threshold distributions. The write-verify is performed as similar to the normal data read except that a verify-read voltage set to be equal to the lower limit of the data threshold distribution is applied to the selected word line.

In case it is detected that there is a write-insufficient cell as a result of the write-verify, the write voltage will be applied again. To do such the verify control, write data stored in data latch 12 is transferred to and held at data node DDA. With this write data, the write data in data latch 12 is rewritten based on the verify-read result in such a way that only write-insufficient cells are subjected to "0" write again in the following cycle.

As a result, in the write-verify, the write data in data latch 12 is controlled in such a manner that when all "0" write is completed, data latches 12 in one page sense units are set to be an all "1" state. The verify-check circuit 14 is prepared to detect the above-described data state and judge data write completion.

With reference to the above-described basic operations, the detailed operations of the NAND-type flash memory in accordance with this embodiment will be explained below.

[In Case of 8-Value Data Storage Scheme]

Figure 8:
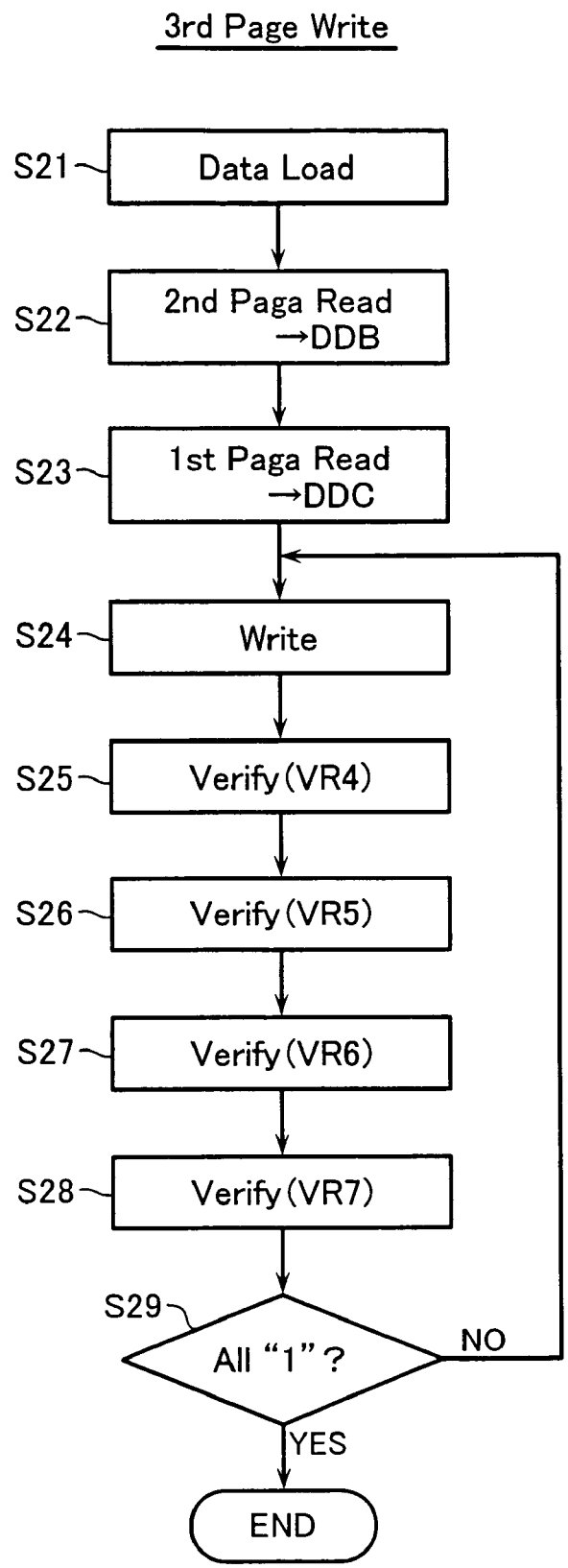
FIG. 8 shows a third page write sequence.

Supposing that the normal data area stores 8-value data, the 8-value data in this embodiment has, as shown in FIG. 1A, 8-levels from the lowest threshold level (i.e., erase state) L0 to the highest threshold level L7, and three data bits are assigned to these levels. That is, 8-value data is expressed as (xyz), where "x" is a third page (i.e., the upper page) data bit; "y" a second page (i.e., middle page) data bit; and "x" a first page (i.e., the lower page) data bit. Data write is performed in order of the first, second and third pages.

1st page write is performed with supplying write data "0" and "1" to the erased cells of the threshold level L0. "0" write data makes the cells have the threshold voltage of L1 while "1" write makes the cells be as it is. To decide the threshold level L1, a verify voltage VR1 is used as being set at the lower limit of the data threshold distribution. With this 1st page write, the lower page data "0" and "1" are written.

2nd page write is performed with selective "0" write for cells with the threshold level L1 (i.e., selectively writing the threshold level L2 into cells of the threshold level L1) and selective "0" write for cells with the threshold level L0 (i.e., selectively writing the level L3 into cells of the threshold level L0). In these two kinds of 2nd page writes, write voltage application operations are performed simultaneously while write-verify operations are performed on the different conditions from each other. In detail, write-verify operations for verifying the threshold levels L2 and L3 are performed with verify voltages VR2 and VR3, respectively, at different timings.

3rd page write is performed with selective "0" write for cells of the threshold levels L3, L2, L1 and L0 (i.e., writing levels L4, L5, L6 and L7 into these cells, respectively). In these four kinds of 3rd page writes, write voltage application operations are performed simultaneously while write-verify operations are performed at different timings with verify voltages VR4, VR5, VR6 and VR7, respectively.

In the flag data area, "0" write is performed for selectively writing the threshold level L1 into the erased state cells at the same timing as the 1st page write in the normal data area as shown in FIG. 1B. This data of the level L1 is dealt with a dummy data as shown by a dotted line in FIG. 1B.

Further, "0" write is performed for making the entire cell data of the threshold level L1 have the threshold level L2 on the same condition as "0" write from the threshold level L1 to level L2 in the normal data area. This data of the threshold level L2 also is dealt with a dummy data.

Finally, "0" write is performed for making the entire cell data of the level L2 have the threshold level L5 on the same condition as "0" write from level L2 to level L5 in the normal data area.

As described above, binary data with the threshold levels L0 and L5 may be written into the flag data area through the three write steps for the normal data area. Since, as shown in FIGS. 1A and 1B, the read pass voltage Vread is set higher than the uppermost threshold level L7, binary data levels in the flag data area are set sufficiently lower than the read pass voltage Vread, so that the reliability of the flag data becomes high.

Figure 6:
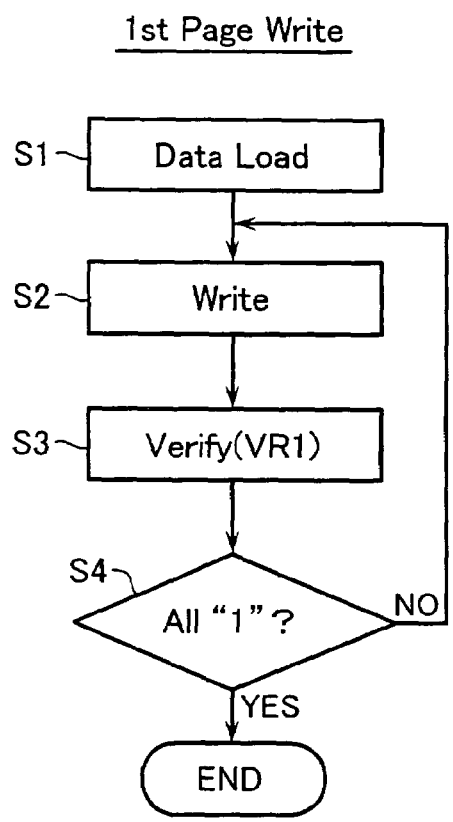
FIG. 6 shows a first page write sequence in case of an 8-value storage scheme.
Figure 7:
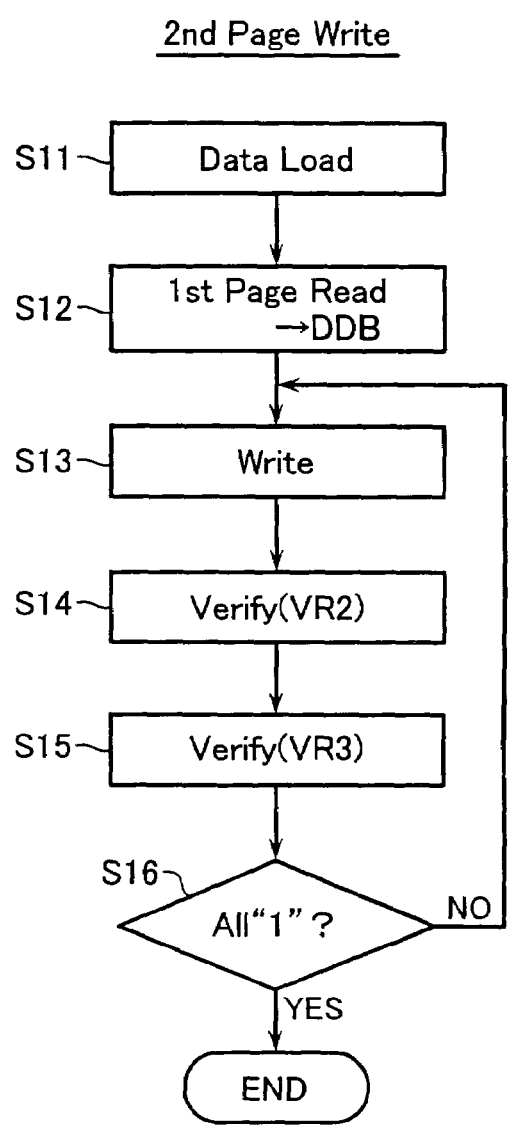
FIG. 7 shows a second page write sequence.

Next, the detail of each page write, in which normal data area and flag data area are written simultaneously, will be explained with reference to FIGS. 6 to 8 below. Although the write sequences of the respective pages are shown in FIGS. 6 to 8 as being independent of each other for the sake of convenience. To adapt these in practice, it is used such a sequence that after the entire page data are loaded in the memory chip, 1st to 3rd pages will be continuously written.

FIG. 6 shows the write sequence of 1st page write. Following command and address input, write data (including normal data and flag data) are loaded in data latches 12 in the sense units SAU (step S1), and data write becomes ready. Each write data in data latch 12 is transferred to and held at data node DDA for verify-controlling.

Based on the write data held in data latches 12, channels of the selected cells are controlled in potential as described above, and a selected word line is applied with the write voltage, and then a write operation will be performed (step S2).

After applying the write voltage, a write-verify operation will be performed (step S3). This write-verify is for verifying "0" write for obtaining the threshold level L1 in both the normal data area and the flag data area with verify-read voltage VR1.

As a result of the write-verify, data node TDC corresponding to a "0" written cell becomes "H" while data node TDC corresponding to a "1" write cell (write-inhibiting cell) or an insufficiently "0" written cell becomes "L". Then, data held at data nodes DDA are written back to data nodes TDC. With this write back, data nodes TDC may be set to be "L" with respect to only such cells that "0" write is insufficient.

Explaining this situation in detail, "1" and "0" write data are stored at data nodes DDA as "H" and "L" levels, respectively. Data write back is performed with applying VPRE=Vdd to the drain of transistor Q11, and turning on transistor Q17. Under this write back condition, in case of "1" write and sufficient "0" write, TDC becomes "H" while only in case of insufficient "0" write, TDC becomes "L".

This data state at node TDC is transferred to and held in data latch 12 as write data in the following cycle. The write data is transferred to and held at data node DDA again, and the successive data write is performed.

Write completion judgment step S4 is for detecting whether all "1" is obtained or not in one page data latches 12. If "NO", the write voltage application and the write-verify are repeatedly performed. If one page write is completed, the verify-check circuit 14 detects the all "1" state of one page data, and in response to it this write sequence ends.

FIG. 7 shows the second page write sequence. Loaded is write data (step S11), which will be transferred to data node DDA from data latch 12.

For the second page write, as described with reference to FIGS. 1A and 1B, it is in need of referring to first page data, which has already been written, and using a write condition defined in accordance with the first page data. For the purpose, it will be performed such an internal data load operation that the first page data written in the cell array are read out to data latches 12 (step S12). The first data read from the cell array are, for example, transferred to and held at data nodes DDB.

Thereafter, the second page write is performed in accordance with write data held at data nodes DDA (step S13). For write-verifying, a first verify step S14 with verify voltage VR2 and a second verify step S15 with verify voltage VR3 will be necessary.

The first verify step S14 is for verifying such a "0" write that makes a cell have the threshold level L2, the first page data of which is "0". Write-verify of the flag data area is performed on the same condition. In this verify step S14, in which verify voltage VR2 is used, it is in need of excluding data to be verified in the second verify step S15 with verify voltage VR3 from the verify target. For this purpose, the first page data held at data storage nodes DDB are used.

The operation for excluding data to be verified in the second verify step is performed in detail in such a manner that the data node TDC after verify-read is forcedly discharged to be in an "L" level state (i.e., "1" data state) with first page data held at data storage node DDB. For forcedly discharging the data node TDC, "0" and "1" data are stored as "L" and "H" data, respectively, in the data storage nodes DDB; drain voltage VPRE of transistor Q12 is set to be Vss; and transistor Q18 is turned on.

Data "1" and "0" read from the cell array to the data node TDC are "L" and "H", respectively. Therefore, the first page data stored at the data node DDB for the above-described forced discharge is required to be inverted in logic to the read data from the cell array. This logic inversion of the read data may be performed as follows.

Read data is initially transferred to and temporarily held at data storage node DDB as it is. Then, after precharging the data node TDC to be "H" (=Vdd), VPRE=Vss is applied to the drain of transistor Q12, so that the data node TDC is made discharged in accordance with data held at data node DDB. Data at the data node TDC will be transferred to data latch 12 again, and then held at data storage node DDB. As a result, it becomes possible to store the logic inverted read data at data storage node DDB.

After the first verify step S14, second verify step S15 is performed for verifying "0" write of the threshold level L3. In this verify step S15, data write-back is performed in accordance with the write data held at data storage node DDA in such a way that "0" write is performed again for only write-insufficient cells with the lower threshold level than L3.

Then, to judge write completion, it is detected whether one page data in the data latches 12 become all "1" or not (step S16). The above described write and write-verify are repeated until when the write completion is judged.

FIG. 8 shows the third page write sequence. It is required of this sequence to use write conditions defined in accordance with the first and second page data, which have already been written. Therefore, after loading the third page data (step S21), internal data load is performed in such a way that the second page data and the first page data are sequentially read from the cell array (steps S22 and S23).

For example, the third page write data is transferred to and held at data storage node DDA; and the second and the first page data at data storage nodes DDB and DDC, respectively.

As a result, data write becomes ready. Next, cell channel potential control is performed in accordance with data stored at data storage node DDA, and write voltage application is performed (step S24).

Write-verify is executed with four steps S25, S26, S27 and S28 with verify voltages VR4, VR5, VR6 and VR7, respectively, in accordance with the first and second page data states. The first verify step S25 is for verifying selective "0" write (i.e., threshold level L4 write) into cells with data (yz)=(01) defined by the threshold level L3 by use of the verify voltage VR4. The second verify step S26 is for verifying selective "0" write (i.e., threshold level L5 write) into cells with data (yz)=(00) defined by the threshold level L2 by use of the verify voltage VR5. The third page data write for the flag data area is executed on this condition.

The third verify step S27 is for verifying selective "0" write (i.e., threshold level L6 write) into cells with data (yz)=(10) defined by the threshold level L1 by use of the verify voltage VR6. The fourth verify step S28 is for verifying selective "0" write (i.e., threshold level L7 write) into cells with data (yz)=(11) defined by the threshold level L0 by use of the verify voltage VR7.

In the first verify step S25, it is in need of excluding "0" write for threshold levels L5-L7 from the verify target. For this purpose, the data node TDC after verify-read is forcedly discharged in accordance with the second and first page data held at data nodes DDB and DDC, i.e., in accordance with data (yz)=(11), (10) and (00).

Although the detailed explanation is omitted, the second and first page data are, when necessary, inverted in level to be held at data storage nodes DDB and DDC as similar to the above-described second page write-verify. In accordance with combinations of these data, the data node TDC will be forcedly discharged to be "L" at the verify-read time.

As similar to the above description, verify-control is performed based on the page data (yz), which has already been written in such a manner that only "0" write for obtaining threshold level L5 becomes verify target in the second step S26; and only "0" write for obtaining threshold level L6 becomes verify target in the third step S27. In the fourth step S28, only "0" write for obtaining threshold level L7 becomes target without regard to the written page data.

After these verify steps, write completion is judged (step S29), and write voltage application and write-verify are repeatedly performed until write completion. With the above-described write sequence, binary data "1" and "0" defined by the threshold levels L0 and L5, respectively, are written into the flag data area.

8-value data in the normal data area are read out in order of the third, second and first pages. The third page data may be read out with read voltage R4 set between threshold levels L3 and L4. The binary data in the flag data area may be read out on the same read condition as the third page data.

Cell data in one sector (one page) are simultaneously read from the cell array to the sense amplifier circuit. That is, the normal data area and the flag data area are accessed simultaneously. However, data output operation for outputting read data to the external I/O terminals may be controlled, for example, in such a way that only the flag data is output by use of column selection. That is, with column selection, it is possible to output only the flag information, which notifies whether data rewrite in the normal data area is permitted or not, outside of the chip.

It is required of the second page read for the normal data area to perform twice read operations as follows. A first read operation is performed for cells with the third page data being "1" with read voltage R2 set between threshold levels L1 and L2 so that threshold levels L0 and L1 read as "1" data are dealt with "1" second page data, and threshold levels L2 and L3 read as "0" are dealt with "0" second page data. A second read operation is performed for cells with the third page data being "0" with read voltage R6 set between threshold levels L5 and L6 so that threshold levels L4 and L5 read as "1" data are dealt with "0" second page data, and threshold levels L6 and L7 read as "0" are dealt with "1" second page data.

It is required of the third page read for the normal data area to perform four read operations as follows: a first read operation is performed for cells with (xy)=(11) to distinguish between threshold levels L0 and L1 with read voltage R1 set between these levels; a second read operation is performed for cells with (xy)=(10) to distinguish between threshold levels L2 and L3 with read voltage R3 set between these levels; a third read operation is performed for cells with (xy)=(00) to distinguish between threshold levels L4 and L5 with read voltage R5 set between these levels; and a fourth read operation is performed for cells with (xy)=(01) to distinguish between threshold levels L6 and L7 with read voltage R7 set between these levels.

Figure 9:
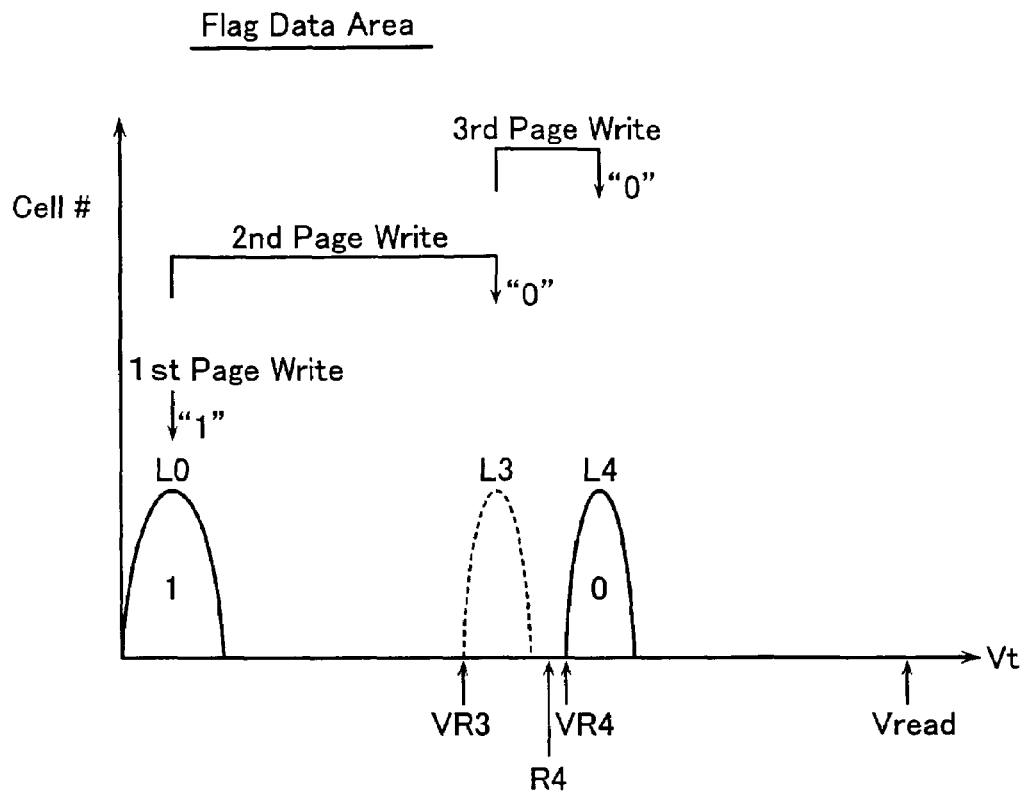
FIG. 9 shows another binary data write method in the flag data area.

FIG. 9 shows another method of writing the flag data area. The first page write is performed as "1" write (i.e., write inhibiting) so that the erased threshold level L0 is kept as it is. The second page write is performed as "0" write on the same condition as "0" write from threshold level L0 to level L3 in the normal data area. This written level L3 is dealt with a dummy data level.

The third page write is performed as "0" write for making the entire cells with threshold level L3 have threshold level L4 on the same condition as "0" write from threshold level L3 to level L4 in the normal data area. As a result, binary data, in which threshold levels L0 and L4 serve as "1" and "0", respectively, is written into the flag data area.

In this binary data in the flag data area, threshold level L4 becomes the upper level, which is further lower than that in the example shown in FIG. 1B. Further, this binary data may be read with the same read voltage R4 as in the third page read of the normal data area.

Figure 10:
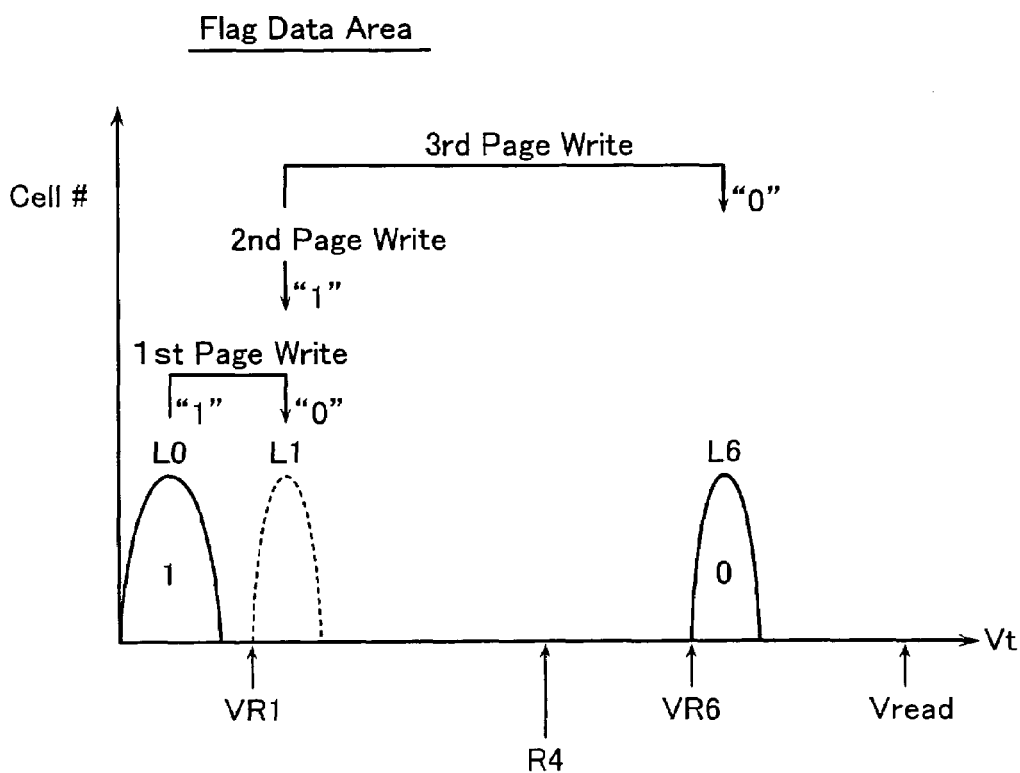
FIG. 10 shows still another binary data write method in the flag data area.

FIG. 10 shows still another method of writing the flag data area. The first page "0" write is performed on the same condition as in the normal data area. This written level L1 is dealt with a dummy data level. The second page write is performed as "1" write (i.e., write inhibiting) so that the threshold level L1 is kept as it is. The third page write is performed as "0" write for making the entire cells with threshold level L1 have threshold level L6 on the same condition as "0" write from threshold level L1 to level L6 in the normal data area. As a result, binary data, in which threshold levels L0 and L6 serve as "1" and "0", respectively, is written into the flag data area.

In this binary data in the flag data area, threshold level L6 becomes the upper level. While the upper level is higher than that in the example shown in FIG. 1B, it is lower than the highest threshold level L7 and has a sufficient margin between the read pass voltage Vread and itself. This binary data may be read out with the same read voltage R4 as used for reading the third page data in the normal data area.

[In Case of 4-Value Data Storage Scheme]

Figure 11A:
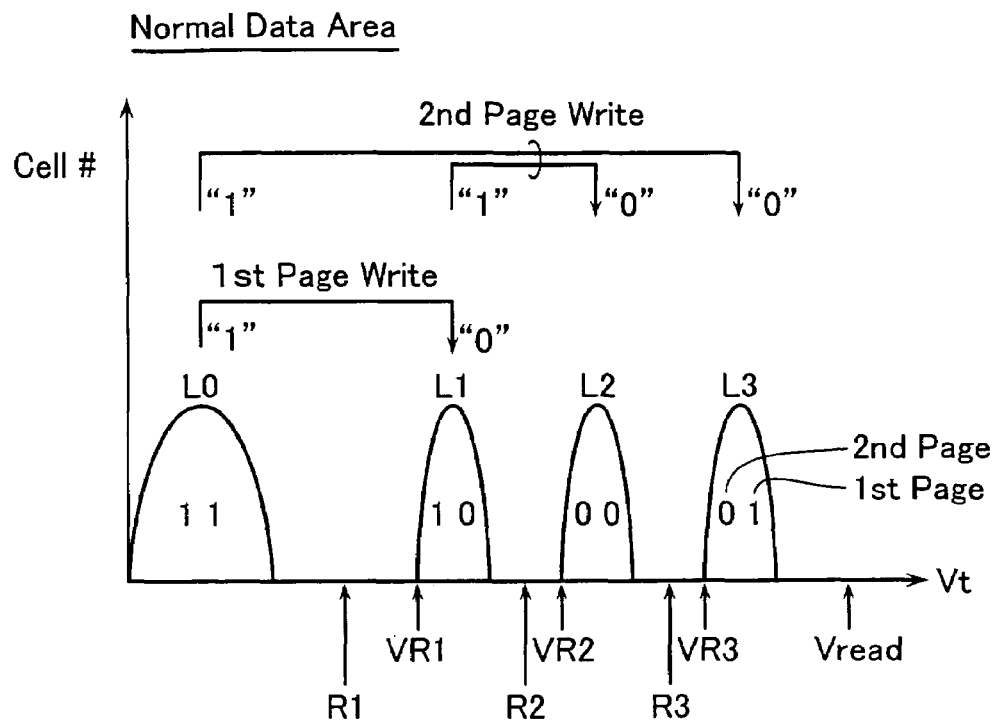
FIG. 11A shows threshold voltage distributions, data bit assignment and write method of 4-value data in the normal data area of a flash memory in accordance with another embodiment.
Figure 11B:
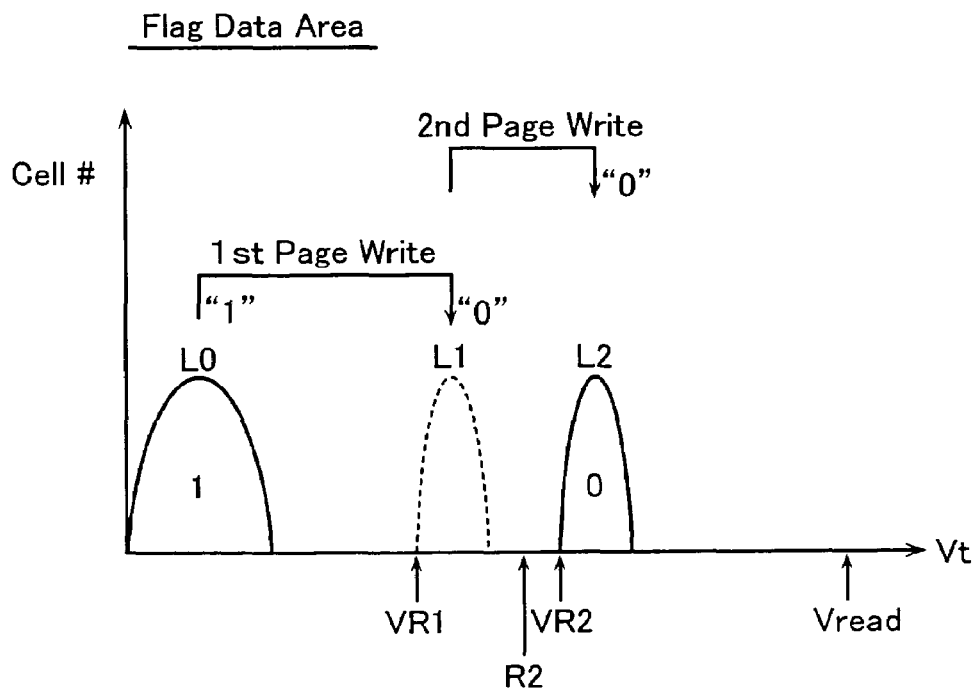
FIG. 11B shows threshold voltage distributions, data bit assignment and write method of binary data in the flag data area of the flash memory.

In case the normal data area stores 4-value data, the data bit assignment and write method of the normal data area are shown in FIG. 11A while FIG. 11B shows the bit assignment and write method of the flag data area.

4-value data is defined by four levels of the lowest threshold level L0 and the following threshold levels L1, L2 and L3. As 4-value data (yz), which is defined by a second page data (upper page data) "y" and a first page data (lower page data) "z", (11), (10), (00) and (01) are assigned to the four threshold levels L0, L1, L2 and L3, respectively.

4-value data write is performed in such an order that the first page is written and then the second page is written. Since the write method is basically the same as in the 8-value storage scheme, the detailed explanation will be omitted.

Binary data write into the flag data area is performed with a "0" write operation (i.e., dummy write) from level L0 to level L1 on the same condition as the first page write of 4-value data and anther "0" write operation into the dummy write cells on the same condition as one of the second page write from level L1 to level L2.

The second page of the normal data area is read out with a read voltage R2 set between threshold levels L1 and L2. The first page data is, with reference to the second page data, through a first read step with read voltage R2 set between threshold levels L0 and L1 and a second read step with read voltage R3 set between threshold levels L2 and L3.

The binary data of the flag data area may be read out on the same condition as the second page read for the normal data area.

In the 4-value data storage scheme, the read pass voltage Vread is, as shown in FIG. 11A, set to be higher than the uppermost threshold level L3. Binary data in the flag data area is defined by threshold levels L0 and L2, which serves as "1" and "0", respectively, so that it is possible to take a sufficiently large margin against the read pass voltage Vread.

[In Case of 16-Value Data Storage Scheme]

Figure 12B:
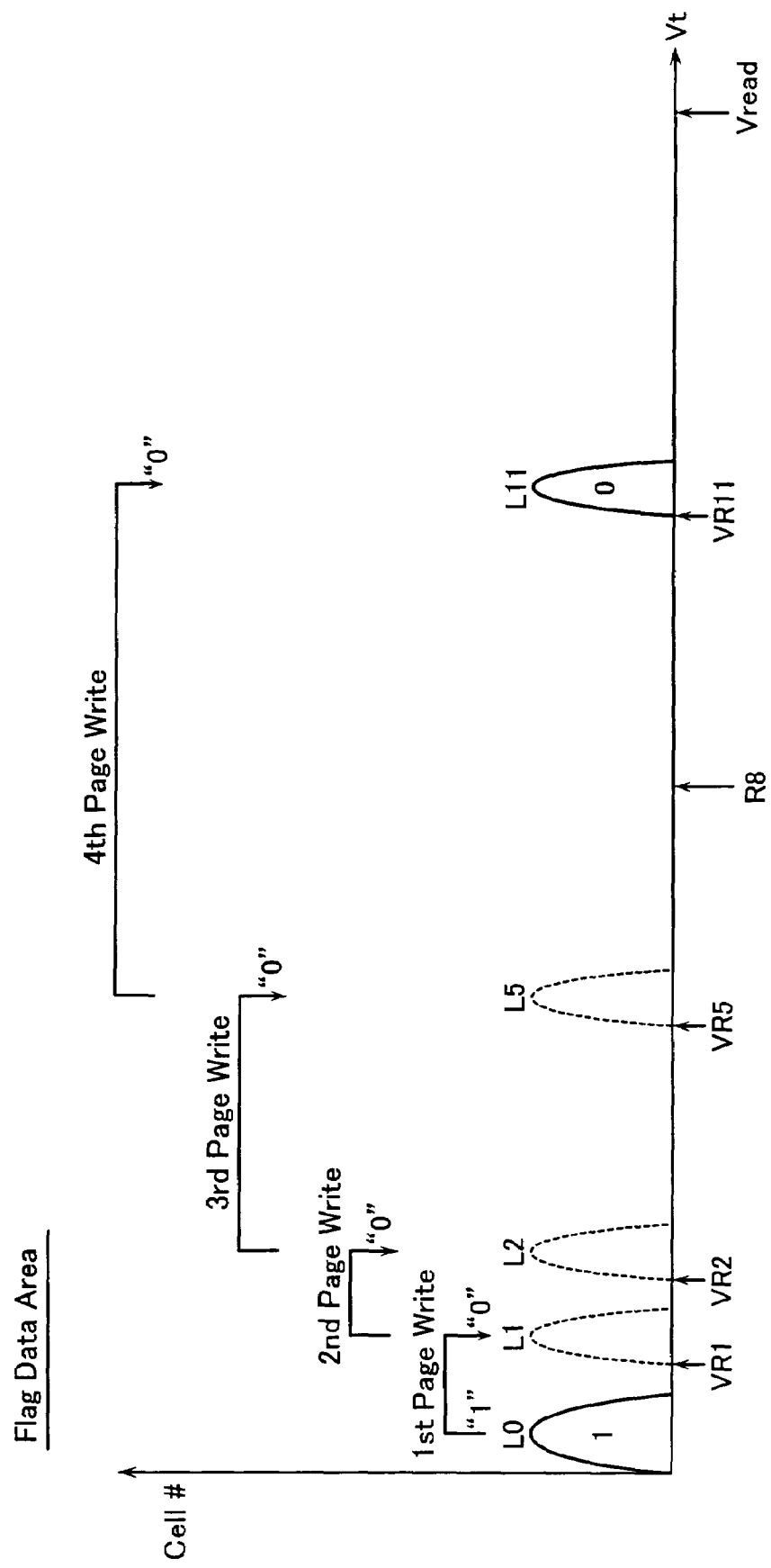
FIG. 12B shows threshold voltage distributions, data bit assignment and write method of binary data in the flag data area of the flash memory.

In case the normal data area stores 16-value data, the data bit assignment and write method of the normal data area are shown in FIG. 12A, while FIG. 12B shows the bit assignment and write method of the flag data area.

16-value data is defined by sixteen threshold levels, from the lowest level L0 to the following levels L1-L15. Four page data are assigned to these sixteen threshold levels as follows. As 16-value data (wxyz), which is defined by a fourth page data "w", a third page data "x", a second page data "y" and a first page data "z", (1111), (1110), (1100), (1101), (1001), (1000), (1010), (1011), (0011), (0010), (0000), (0001), (0101), (0100), (0110) and (0111) are assigned to the sixteen threshold levels L0 to L15, respectively, in order of levels.

16-value data is written in order of the first, second, third and fourth pages. The write method is obtained by expanding that in the 8-value data storage scheme. That is, write operations from the first page to the third page are performed as the same as in the 8-value data storage scheme, and the fourth page write is additionally performed.

The fourth page write has such eight write modes that "0" write-verifies are performed for verifying write states of threshold levels L8, L9, L10, L11, L12, L13, L14 and L15 with verify voltages VR8, VR9, VR10, VR11, VR12, VR13, VR14 and VR15, respectively. For the control of the fourth page write-verify, it is in need of reading out and referring to data from the first to the third pages, which have already been written.

Data read of this 16-value data will be performed as follows. The fourth page data is read out with read voltage set between threshold levels L7 and L8. The third page data is read out with reference to the fourth page data through first and second read operations with read voltage R4 set between threshold levels L3 and L4 and read voltage R12 set between threshold levels L11 and L12, respectively;

The second page data is read out with reference to the third and fourth page data through first, second, third and fourth read operations with read voltages R2, R6, R10 and R14, which are set between threshold levels L1 and L2, threshold levels L5 and L6, threshold levels L9 and L10, and threshold levels L13 and L14, respectively.

The first page data is read out through first, second, third, fourth, fifth, sixth, seventh and eighth read operations with read voltages R1, R3, R5, R7, R9, R11, R13 and R15, which are set between threshold levels L0 and L1, threshold levels L2 and L3, threshold levels L4 and L5, threshold levels L6 and L7, threshold levels L8 and L9, threshold levels L10 and L11, threshold levels L12 and L13, and threshold levels L14 and L15, respectively.

Binary data in this case may be read out on the same condition as in the fourth page data read, i.e., with read voltage R8.

The sense unit SAU shown in FIG. 5 is formed as being adaptable to 8-value data storage scheme. To make it adaptable to 16-value data storage scheme, it is in need of preparing another data storage node in addition to the data storage nodes DDA, DDB and DDC.

In case 16-value data is stored in the normal data area as shown in FIG. 12A, as shown in FIG. 12B, binary data is stored in the flag data area through the first to fourth page write steps used for the normal data area. That is, threshold level L1 is written on the same condition as the first page "0" write; threshold level L2 is written into cells with threshold level L1 on the same condition as the second page "0" write; and threshold level L5 is written into cells with threshold level L2 on the same condition as one of the third page "0" write. So far, the write condition is the same as in the above-described 8-value data storage scheme.

Further in addition to these write steps, threshold level L11 is written into the entire cells with threshold level L5 in the flag data area on the same condition as one of the fourth page "0" write, i.e., selective writing threshold level L11 into cells with threshold level L5 with verify voltage VR11. As described above, threshold levels L1, L2 and L5 written through the first to third page "0" write are dealt with dummy data, threshold level L11 is finally written as binary data bit "0", while the erased state L0 is binary data bit "1".

Data read of the flag data area is performed on the same condition as the fourth page read in the normal data area, i.e., with read voltage R8 set between levels L7 and L8.

[Write Data Control]

In the example shown in FIGS. 1A and 1B, in which 8-value data storage scheme is typically explained, page write sequences are shown as being independent of each other in FIGS. 6 to 8. However, a practical data write is performed in such a way that 3-page write data are loaded in the memory chip page by page, and then 3-page write is performed continuously.

Since the flag data area is a binary data area, write data to be externally supplied is only one page. However, as described with reference to FIGS. 1A and 1B, it is required of the flag data to be supplied to the memory chip as 3-page data. With an external controller, which supplies write data into the memory chip, it is possible to convert the externally supplied flag data, i.e., binary data, to apparent 8-value data with 3-page data.

Figure 13:
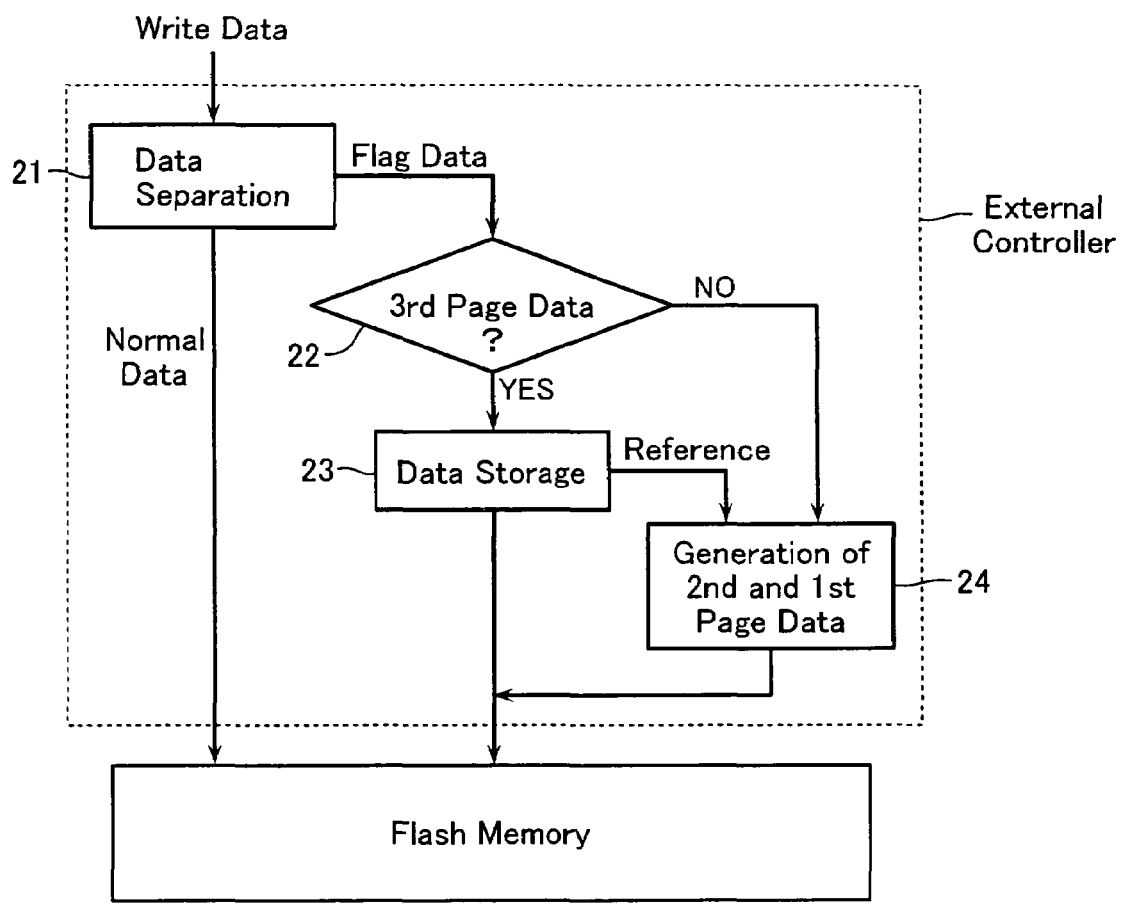
FIG. 13 shows a write data control method in an external controller.

FIG. 13 shows such the write data operation in the external controller. At a data separation portion 21, write data supplied to the external controller is separated into normal data and flag data. Supposing that the normal data area and the flag data area are distinguished from each other by column address as described above, this data separation may be performed in accordance with column address.

The normal data are sequentially loaded in the flash memory chip page by page. The first, second and third page data are loaded in the data latch 12, and transferred to and temporarily stored at the data storage nodes DDA, DDB and DDC, respectively.

Externally supplied flag data is, for example in the example shown in FIGS. 1A and 1B, binary data corresponding to the third page data. Therefore, at a data defining portion 22, it is detected whether the separated data is the third page data or not. If the separated data is the third page data, it will be temporarily stored at a data storage portion 23.

Since there is not first and second page data in the flag data (in other words, first and second page data are all "1" states in the flag data), the data defining portion 22 is able to judge whether it is first or second page data or not. The first and second page data may be generated with reference to the third page data at a data generation portion 24.

In detail, the data generation portion 24 inverts a certain bit in all "1" data to "0", thereby generating the first and second page data. That is, invert a bit, which corresponds to "0" in the third page data, to "0" in all "1" data corresponding to the first and second page data in the flag data, and the first and second page data in the flag data in the example shown in FIG. 1B may be generated. 3-page data generated as described above are sequentially supplied to the flash memory chip.

Note here that since the normal data area and flag data area are distinguished from each other by column address, these areas may be written independently of each other after having erased at a time. That is, when only the normal data area is written, the flag data area is set as an all "1" write state (i.e., write inhibiting state); while when only the flag data area is written, the normal data area is set as an all "1" write state (i.e., write inhibiting state).

[Application Devices]

As an embodiment, an electric card using the non-volatile semiconductor memory devices according to the above-described embodiments of the present invention and an electric device using the card will be described bellow.

Figure 14:
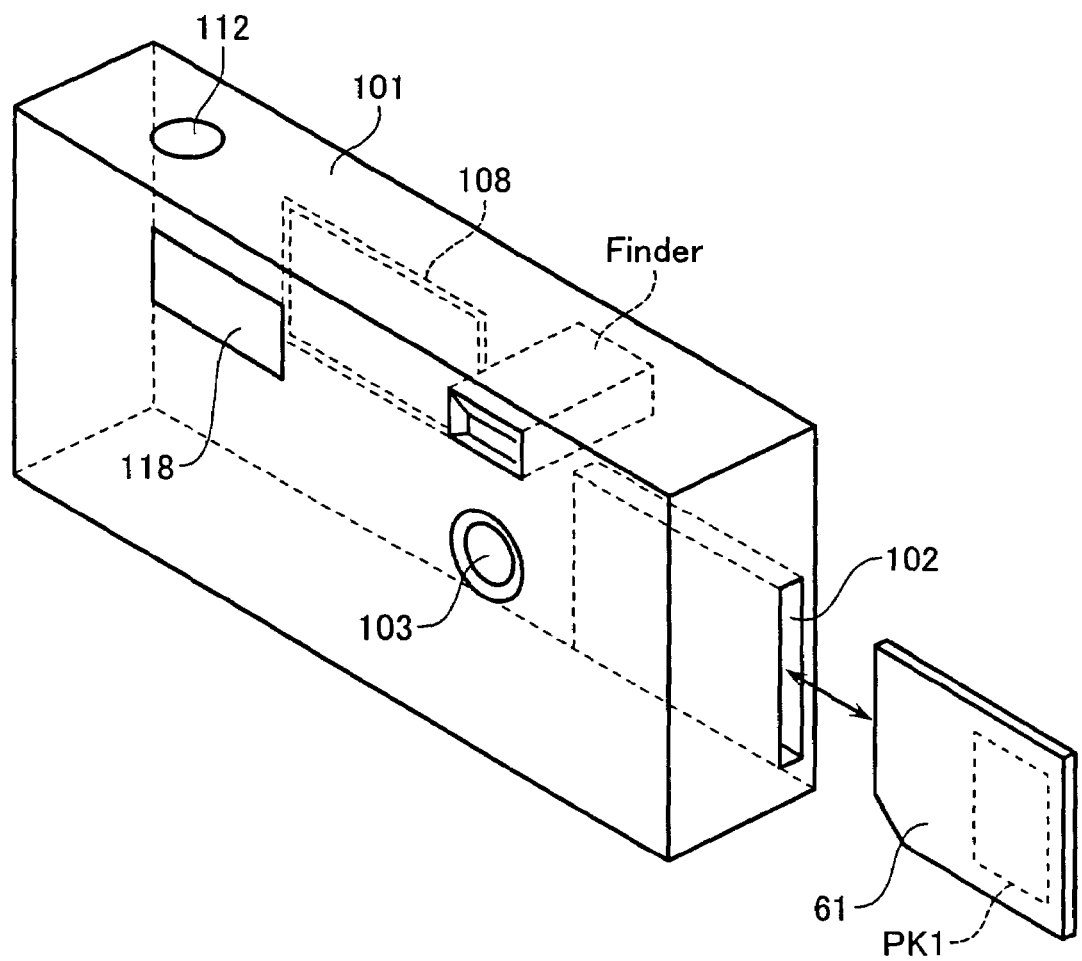
FIG. 14 shows another embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
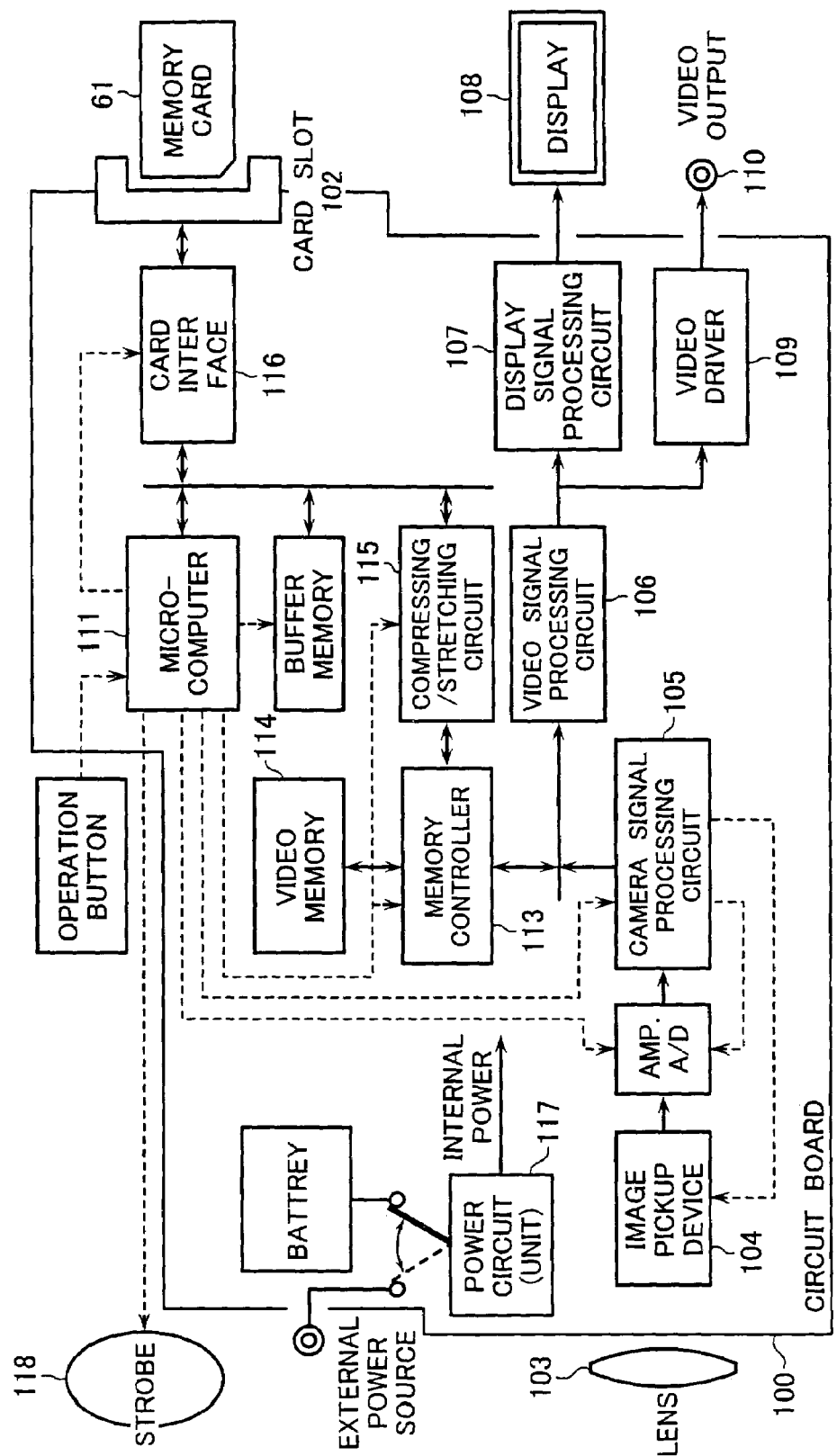
FIG. 15 shows the internal configuration of the digital still camera.
Figure 16A:
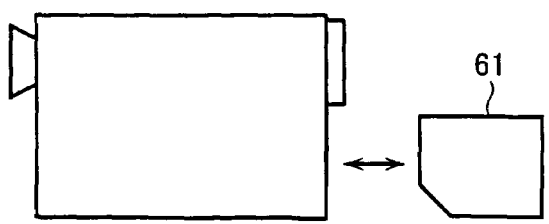
FIGS. 16A to 16J show other electric devices to which the embodiment is applied.
Figure 16F:
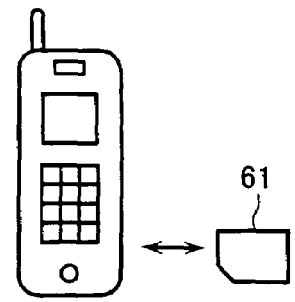
Figure 16B:
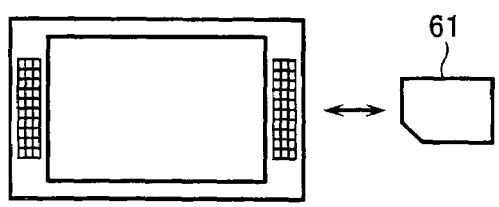
Figure 16G:
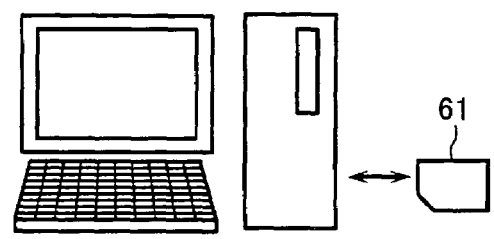
Figure 16C:
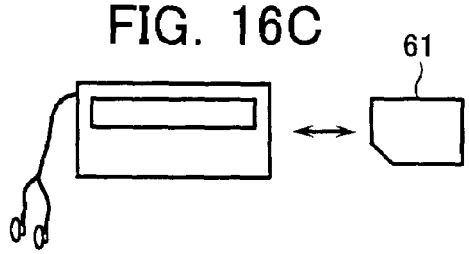
Figure 16H:
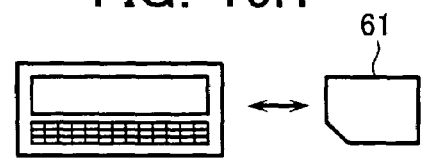
Figure 16D:
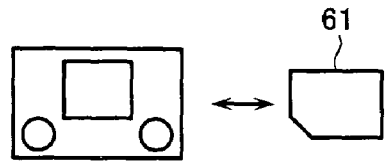
Figure 16I:
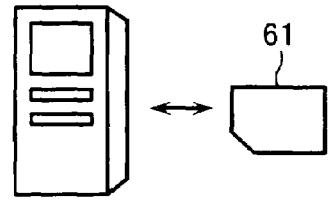
Figure 16E:
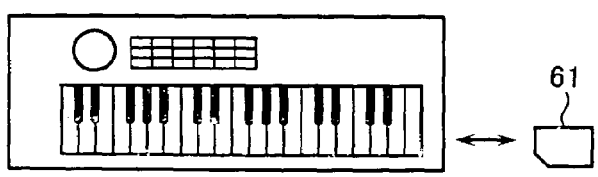
Figure 16J:
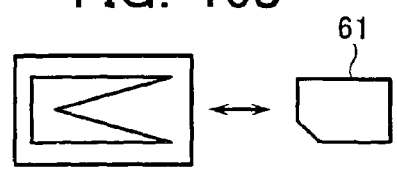

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 165, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 16A to 16J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical instrument shown in FIG. 16E, a cell phone shown in FIG. 16F, a personal computer shown in FIG. 16G, a personal digital assistant (PDA) shown in FIG. 16H, a voice recorder shown in FIG. 16I, and a PC card shown in FIG. 16J.

This invention is not limited to the above-described embodiment. It will be understood by those skilled in the art that various changes in form and detail may be made without departing from the spirit, scope, and teaching of the invention.

What is claimed is:

1. A semiconductor memory device comprising a memory cell array with memory cells arranged therein, each memory cell storing data defined by threshold voltage thereof, wherein
    the memory cell array includes first and second areas;
    the first area stores multi-value data written with plural write steps; and
    the second area stores binary data defined by first and second logic states, threshold levels of which are controlled through the plural write steps adapted to the multi-value data write.

2. The semiconductor memory device according to claim 1, wherein
    the first and second logic states of the binary data are threshold levels selected to sandwich the center value in the threshold level distributions of the multi-value data, and the binary data is read out with a read voltage adapted to the uppermost page data read of the multi-value data.

3. The semiconductor memory device according to claim 1, wherein
the multi-value data is 8-value data with three-page data defined by threshold levels L0, L1, L2, L3, L4, L5, L6 and L7 arranged in order of height, all erased cells being in the threshold level L0;
the 8-value data in the first area is written in such a way that threshold level L1 is selectively written into cells with threshold level L0 at a first page write step, threshold levels L3 and L2 are selectively written into cells with threshold level L0 and L1, respectively, at a second page write step, and threshold levels L7, L6, L5 and L4 are selectively written into cells with threshold levels L0, L1, L2 and L3, respectively, at a third page write step; and
the binary data in the second area is written in such a way that threshold level L0 is dealt with the first logic state, and one of threshold levels L4, L5 and L6 is selectively written as the second logic state into cells with level L0 though the first to third write steps for the 8-value data write, the first and second write steps being used as dummy write steps.

4. The semiconductor memory device according to claim 3, wherein
the third page data of the 8-value data in the first area is read out with a read voltage set between threshold levels L3 and L4;
the second page data of the 8-value data in the first area is read out with reference to the third page data through a first read step with a read voltage set between threshold levels L1 and L2, and a second read step with a read voltage set between threshold levels L5 and L6;
the first page data of the 8-value data in the first area is read out with reference to the third and second page data through a first read step with a read voltage set between threshold levels L0 and L1, a second read step with a read voltage set between threshold levels L2 and L3, a third read step with a read voltage set between threshold levels L4 and L5, and a fourth read step with a read voltage set between threshold levels L6 and L7; and
the binary data in the second area is read out on the same condition as the third page data read step for the first area.

5. The semiconductor memory device according to claim 1, wherein
the multi-value data is 16-value data with four-page data defined by threshold levels L0, L1, L2, L3, L4, L5, L6, L7, L8, L9, L10, L11, L12, L13, L14 and L15 arranged in order of height, all erased cells being in the threshold level L0;
the 16-value data in the first area is written in such a way that threshold level L1 is selectively written into cells with threshold level L0 at a first page write step, threshold levels L3 and L2 are selectively written into cells with threshold level L0 and L1, respectively, at a second page write step, threshold levels L7, L6, L5 and L4 are selectively written into cells with threshold levels L0, L1, L2 and L3, respectively, at a third page write step, and threshold levels L15, L14, L13, L12, L11, L10, L9 and L8 are selectively written into cells with threshold levels L0, L1, L2, L3, L4, L5, L6 and L7, respectively, at a fourth page write step; and
the binary data in the second area is written in such a way that threshold level L0 is dealt with the first logic state, and one of threshold levels L8, L9, L10, L11, L12, L13 and L14 is selectively written as the second logic state into cells with threshold level L0 though the first to fourth write steps for the 16-value data write, the first to third write steps being used as dummy write steps.

6. The semiconductor memory device according to claim 5, wherein
the fourth page data of the 16-value data in the first area is read out with a read voltage set between threshold levels L7 and L8;
the third page data of the 16-value data in the first area is read out through a first read step with a read voltage set between threshold levels L3 and L4, and a second read step with a read voltage set between threshold levels L1 and L2;
the second page data of the 16-value data in the first area is read out through a first read step with a read voltage set between threshold levels L1 and L2, a second read step with a read voltage set between threshold levels L5 and L6, a third read step with a read voltage set between threshold levels L9 and L10, and a fourth read step with a read voltage set between threshold levels L13 and L14;
the first page data of the 16-value data in the first area is read out through a first read step with a read voltage set between threshold levels L0 and L1, a second read step with a read voltage set between threshold levels L2 and L3, a third read step with a read voltage set between threshold levels L4 and L5, a fourth read step with a read voltage set between threshold levels L6 and L7, a fifth read step with a read voltage set between threshold levels L8 and L9, a sixth read step with a read voltage set between threshold levels L10 and L11, a seventh read step with a read voltage set between threshold levels L12 and L13, and an eighth read step with a read voltage set between threshold levels L14 and L5; and
the binary data in the second area is read out on the same condition as the fourth page data read step for the first area.

7. The semiconductor memory device according to claim 1, wherein
the memory cell array is formed of NAND cell units arranged therein, each of which includes a plurality of the memory cells connected in series.

8. The semiconductor memory device according to claim 1, wherein
the first area is a normal data storage area; and
the binary data area is a flag data storage area, in which flag data is stored for notifying whether data rewrite of the first area is permitted or not.

9. The semiconductor memory device according to claim 1, wherein
the first and second areas are defined in the memory cell array as being arranged in the direction of a word line, and accessed simultaneously.

10. A semiconductor memory device comprising:
a memory cell array having word lines and bit lines disposed to intersect each other, and electrically rewritable and non-volatile memory cells disposed at crossings of the word lines and bit lines;
a row decoder configured to selectively drive the word lines; and
a sense amplifier circuit coupled to the bit lines, wherein
the memory cell array includes first and second areas, which are defined therein as being arranged in the direction of the word lines and accessed simultaneously,
the first area stores multi-value data written with plural write steps, and the second area stores binary data defined by first and second logic states, which are written through the plural write steps adapted to the multi-value data write.

11. The semiconductor memory device according to claim 10, wherein
the multi-value data is defined by four or more threshold levels, to which data bits of plural pages are assigned,
the binary data is defined in such a manner that the lowest threshold level in the multi-value data serves as the first logic state while a threshold level higher than the center value of the threshold distributions of the multi-value data and lower than the highest threshold level in the multi-value data serves as the second logic state, and the binary data is read out with a read voltage adapted to the highest page data read of the multi-value data.

12. The semiconductor memory device according to claim 10, wherein
the multi-value data is 8-value data with three-page data defined by threshold levels L0, L1, L2, L3, L4, L5, L6 and L7 arranged in order of height, all erased cells being in the threshold level L0;
the 8-value data in the first area is written in such a way that threshold level L1 is selectively written into cells with threshold level L0 at a first page write step, threshold levels L3 and L2 are selectively written into cells with threshold level L0 and L1, respectively, at a second page write step, and threshold levels L7, L6, L5 and L4 are selectively written into cells with threshold levels L0, L1, L2 and L3, respectively, at a third page write step; and
the binary data in the second area is written in such a way that threshold level L0 is dealt with the first logic state, and one of threshold levels L4, L5 and L6 is selectively written as the second logic state into cells with level L0 though the first to third write steps for the 8-value data write, the first and second write steps being used as dummy write steps.

13. The semiconductor memory device according to claim 12, wherein
the third page data of the 8-value data in the first area is read out with a read voltage set between threshold levels L3 and L4;
the second page data of the 8-value data in the first area is read out with reference to the third page data through a first read step with a read voltage set between threshold levels L1 and L2, and a second read step with a read voltage set between threshold levels L5 and L6;
the first page data of the 8-value data in the first area is read out with reference to the third and second page data through a first read step with a read voltage set between threshold levels L0 and L1, a second read step with a read voltage set between threshold levels L2 and L3, a third read step with a read voltage set between threshold levels L4 and L5, and a fourth read step with a read voltage set between threshold levels L6 and L7; and
the binary data in the second area is read out on the same condition as the third page data read step for the first area.

14. The semiconductor memory device according to claim 10, wherein
the multi-value data is 16-value data with four-page data defined by threshold levels L0, L1, L2, L3, L4, L5, L6, L7, L8, L9, L10, L11, L12, L13, L14 and L15 arranged in order of height, all erased cells being in the threshold level L0;
the 16-value data in the first area is written in such a way that threshold level L1 is selectively written into cells with threshold level L0 at a first page write step, threshold levels L3 and L2 are selectively written into cells with threshold level L0 and L1, respectively, at a second page write step, threshold levels L7, L6, L5 and L4 are selectively written into cells with threshold levels L0, L1, L2 and L3, respectively, at a third page write step, and threshold levels L15, L14, L13, L12, L11, L10, L9 and L8 are selectively written into cells with threshold levels L0, L1, L2, L3, L4, L5, L6 and L7, respectively, at a fourth page write step; and
the binary data in the second area is written in such a way that threshold level L0 is dealt with the first logic state, and one of threshold levels L8, L9, L10, L11, L12, L13 and L14 is selectively written as the second logic state into cells with threshold level L0 though the first to fourth write steps for the 16-value data write, the first to third write steps being used as dummy write steps.

15. The semiconductor memory device according to claim 14, wherein
the fourth page data of the 16-value data in the first area is read out with a read voltage set between threshold levels L7 and L8;
the third page data of the 16-value data in the first area is read out through a first read step with a read voltage set between threshold levels L3 and L4, and a second read step with a read voltage set between threshold levels L1 and L2;
the second page data of the 16-value data in the first area is read out through a first read step with a read voltage set between threshold levels L1 and L2, a second read step with a read voltage set between threshold levels L5 and L6, a third read step with a read voltage set between threshold levels L9 and L10, and a fourth read step with a read voltage set between threshold levels L13 and L14;
the first page data of the 16-value data in the first area is read out through a first read step with a read voltage set between threshold levels L0 and L1, a second read step with a read voltage set between threshold levels L2 and L3, a third read step with a read voltage set between threshold levels L4 and L5, a fourth read step with a read voltage set between threshold levels L6 and L7, a fifth read step with a read voltage set between threshold levels L8 and L9, a sixth read step with a read voltage set between threshold levels L10 and L11, a seventh read step with a read voltage set between threshold levels L12 and L13, and an eighth read step with a read voltage set between threshold levels L14 and L5; and
the binary data in the second area is read out on the same condition as the fourth page data read step for the first area.

16. The semiconductor memory device according to claim 10, wherein
the multi-value data is 4-value data with two-page data defined by threshold levels L0, L1, L2 and L3 arranged in order of height, all erased cells being in the threshold level L0;
the 4-value data in the first area is written in such a way that threshold level L1 is selectively written into cells with threshold level L0 at a first page write step, and threshold levels L3 and L2 are selectively written into cells with threshold level L0 and L1, respectively, at a second page write step; and
the binary data in the second area is written in such a way that threshold level L0 is dealt with the first logic state, and threshold level L2 is selectively written as the second logic state into cells with level L0 though the first and second page write steps for the 4-value data write, the first write step being used as a dummy write step.

17. The semiconductor memory device according to claim 16, wherein
the second page data of the 4-value data in the first area is read out with a read voltage set between threshold levels L1 and L2;
the first page data of the 4-value data in the first area is read out with reference to the second page data through a first read step with a read voltage set between threshold levels L0 and L1, and a second read step with a read voltage set between threshold levels L2 and L3; and
the binary data in the second area is read out on the same condition as the second page data read step for the first area.

18. The semiconductor memory device according to claim 10, wherein
the memory cell array is formed of NAND cell units arranged therein, each of which includes a plurality of the memory cells connected in series.

19. The semiconductor memory device according to claim 10, wherein
the first area is a normal data storage area; and
the binary data area is a flag data storage area, in which flag data is stored for notifying whether data rewrite of the first area is permitted or not.

20. The semiconductor memory device according to claim 19, wherein the device has such a flag data read mode that normal data and flag data in the first and second area are selected by the row decoder to be read simultaneously in the sense amplifier circuit, and only the flag data therein is selectively output outside of the chip.

* * * * *